US008390065B2

(12) United States Patent  
Yamazaki

(10) Patent No.: US 8,390,065 B2  
(45) Date of Patent: Mar. 5, 2013

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 274 days.

(21) Appl. No.: 12/821,477

(22) Filed: Jun. 23, 2010

(65) Prior Publication Data

US 2010/0327351 A1 Dec. 30, 2010

(30) Foreign Application Priority Data

Jun. 26, 2009 (JP) .................. 2009-152177

(51) Int. Cl.
*H01L 27/01* (2006.01)
*H01L 27/12* (2006.01)
*H01L 31/0392* (2006.01)

(52) U.S. Cl. ............... 257/347; 257/273; 257/280
(58) Field of Classification Search .......... 257/273, 257/288, 347

See application file for complete search history.

(56) References Cited

U.S. PATENT DOCUMENTS

| | | | |
|---|---|---|---|
| 4,873,204 A | 10/1989 | Wong et al. | |
| 4,890,141 A | 12/1989 | Tang et al. | |
| 4,994,402 A | 2/1991 | Chiu | |
| 5,121,186 A | 6/1992 | Wong et al. | |
| 5,338,702 A | 8/1994 | Kobeda et al. | |
| 6,744,104 B1 * | 6/2004 | Aoki et al. | 257/372 |
| 6,882,018 B2 | 4/2005 | Ohtani et al. | |
| 7,115,464 B2 * | 10/2006 | Stephan et al. | 438/224 |
| 7,223,666 B2 * | 5/2007 | Ohtani et al. | 438/344 |
| 7,247,562 B2 | 7/2007 | Ishikawa | |
| 7,288,480 B2 | 10/2007 | Yamaguchi et al. | |
| 7,622,740 B2 | 11/2009 | Ohtani et al. | |
| 7,993,992 B2 | 8/2011 | Ohtani et al. | |
| 8,198,680 B2 | 6/2012 | Ishikawa | |
| 2008/0203501 A1 | 8/2008 | Yamazaki et al. | |
| 2008/0308867 A1 | 12/2008 | Cai et al. | |
| 2010/0055852 A1 | 3/2010 | Ohtani et al. | |
| 2010/0187524 A1 * | 7/2010 | Isobe et al. | 257/43 |
| 2010/0203706 A1 | 8/2010 | Ohnuma et al. | |
| 2010/0230754 A1 | 9/2010 | Isobe et al. | |
| 2010/0327352 A1 | 12/2010 | Yamazaki | |

FOREIGN PATENT DOCUMENTS

| | | |
|---|---|---|
| JP | 06-061177 A | 3/1994 |
| JP | 06-089906 A | 3/1994 |
| JP | 07-283400 A | 10/1995 |

* cited by examiner

*Primary Examiner* — Phuc Dang
(74) *Attorney, Agent, or Firm* — Eric J. Robinson; Robinson Intellectual Property Law Office, P.C.

(57) ABSTRACT

An object is to reduce the resistance of each member included in a transistor, to improve ON current of the transistor, and to improve performance of an integrated circuit. A semiconductor device including an n-channel FET and a p-channel FET which are provided over a single crystal semiconductor substrate with an insulating layer provided therebetween and are isolated by an element isolation insulating layer. In the semiconductor device, each FET includes a channel formation region including a semiconductor material, a conductive region which is in contact with the channel formation region and includes the semiconductor material, a metal region in contact with the conductive region, a gate insulating layer in contact with the channel formation region, a gate electrode in contact with the gate insulating layer, and a source or drain electrode partly including the metal region.

17 Claims, 20 Drawing Sheets

FIG. 20A
FIG. 20B-1
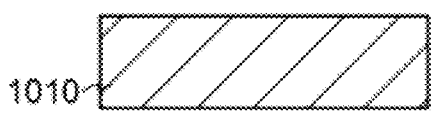
FIG. 20B-2
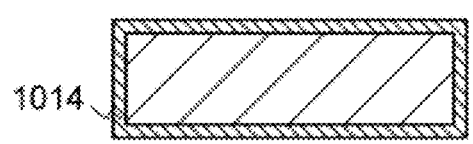
FIG. 20B-3
FIG. 20C
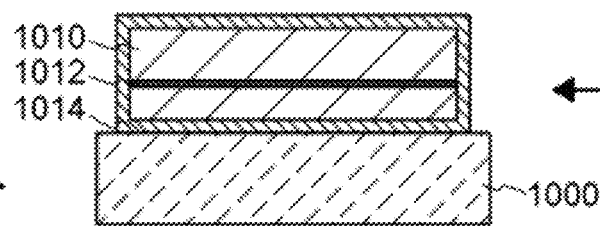
FIG. 20D
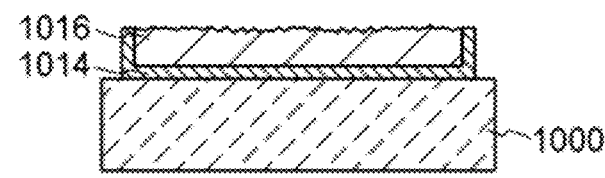
FIG. 20E
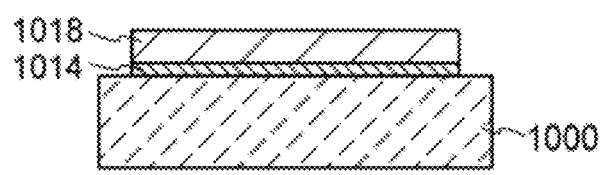

SEMICONDUCTOR DEVICE

BACKGROUND OF THE INVENTION

1. Field of the Invention

The technical field of the present invention relates to a semiconductor device and a method for manufacturing the semiconductor device.

Note that semiconductor devices mean elements and devices in general which function by utilization of semiconductor characteristics.

2. Description of the Related Art

In order to realize high performance (high speed and low power consumption) of an integrated circuit, miniaturization of a transistor has been underway.

In the case where a field effect transistor (a FET) is used as a transistor and miniaturization is performed, miniaturization of a transistor is pursued through the reduction of a channel length obeying a scaling law, the thinning of a gate insulating film, and the like.

As the miniaturization proceeds, a short channel effect becomes apparent. In order to suppress such a short channel effect, a threshold voltage of a transistor is controlled by adjusting an impurity concentration in a semiconductor layer. However, the adjustment of the impurity concentration in the semiconductor layer leads to the reduction of ON current (current drive capability) which is caused by the impurity scattering of carriers and the like. Therefore, it is very advantageous to reduce the resistance of each member (a source region, a drain region, a wiring, and the like) which is included in the transistor in advance. Note that as the miniaturization proceeds, the reduction of the ON current, which is caused by the resistance of each member included in the transistor, becomes more pronounced.

As an example of a field effect transistor, Patent Document 1 discloses a field effect transistor in which a single crystal semiconductor layer is provided over an insulating layer using an SOI (silicon on insulator) technique. In the field effect transistor with an SOI structure in Patent Document 1, a silicide region is formed using an alloy of metal and a semiconductor material in a source region and a drain region, so that the reduction of contact resistance between the field effect transistor and a wiring is realized.

CITATION LIST

Patent Document

[Patent Document 1]
United States Published Patent Application No. 2008-0308867

SUMMARY OF THE INVENTION

Regarding the structure of the field effect transistor described in Patent Document 1, the contact resistance is reduced with the use of a silicide material. However, the structure still has room for improvement in further reduction of the resistance of each member included in the transistor.

Thus, an object of an embodiment of the disclosed invention is to reduce each member included in a transistor. An object is to reduce the resistance of each member included in a transistor, to improve ON current of the transistor, and to improve performance of an integrated circuit.

An embodiment of the disclosed invention is a semiconductor device including a channel formation region including a semiconductor material; a conductive region which is in contact with the channel formation region and includes the semiconductor material; a metal region in contact with the conductive region; a gate insulating layer in contact with the channel formation region; a gate electrode in contact with the gate insulating layer; and a source or drain electrode partly including the metal region.

According to an embodiment of the present invention, in the semiconductor device, a contact interface between the gate insulating layer and the channel formation region may exist above a contact interface between the metal region and the conductive region.

An embodiment of the present invention is a semiconductor device including a channel formation region including a semiconductor material; a conductive region which is in contact with the channel formation region and includes the semiconductor material; a metal compound region which is in contact with the conductive region and includes a metal compound of the semiconductor material; a metal region in contact with the metal compound region; a gate insulating layer in contact with the channel formation region; a gate electrode in contact with the gate insulating layer; and a source or drain electrode partly including the metal region. In the semiconductor device, a metal element included in the metal compound is the same as a metal element included in the metal region.

According to an embodiment of the present invention, in the semiconductor device, a region including the metal compound may be included in part of the gate electrode.

According to an embodiment of the present invention, in the semiconductor device, a concentration of an impurity element imparting conductivity which is added to the conductive region may be higher than or equal to $1 \times 10^{19}$ cm$^{-3}$ and lower than or equal to $1 \times 10^{21}$ cm$^{-3}$.

According to an embodiment of the present invention, in the semiconductor device, the conductive region may include a low conductive region in contact with the channel formation region and may include a high conductive region in contact with the low conductive region, and a concentration of an impurity element imparting conductivity which is added to the low conductive region may be higher than or equal to $1 \times 10^{19}$ cm$^{-3}$ and lower than or equal to $1 \times 10^{21}$ cm$^{-3}$, which may be lower than a concentration of an impurity element imparting conductivity which is added to the high conductive region.

According to an embodiment of the present invention, in the semiconductor device, the metal region may exist also in a region not overlapping with the conductive region.

According to an embodiment of the present invention, in the semiconductor device, the channel formation region may be formed in a semiconductor layer existing over an insulating layer.

According to an embodiment of the present invention, in the semiconductor device, the base substrate may be provided with an insulating layer in an upper portion.

According to an embodiment of the present invention, in the semiconductor device, the base substrate may be any one of a glass substrate, a single crystal silicon substrate, a polycrystalline silicon substrate, or a solar grade silicon substrate.

An embodiment of the present invention is a method for manufacturing a semiconductor device including the steps of forming a gate insulating layer in contact with a region including a semiconductor material; forming a gate electrode in contact with the gate insulating layer; forming a channel formation region overlapping with the gate electrode; forming a conductive region in contact with the channel formation region; removing part of the conductive region; forming a metal region in contact with the conductive region by forming a metal layer in a region where part of the conductive region is removed; and forming a source or drain electrode partly including the metal region.

An embodiment of the present invention is a method for manufacturing a semiconductor device including the steps of forming a gate insulating layer in contact with a region including a semiconductor material; forming a gate electrode in contact with the gate insulating layer; forming a channel formation region overlapping with the gate electrode; forming a conductive region in contact with the channel formation region; and forming a metal compound region which is in contact with the conductive region and includes a metal compound of the semiconductor material and forming a metal region in contact with the metal compound region by forming a metal layer in contact with the conductive region.

According to an embodiment of the present invention, in the method for manufacturing a semiconductor device, the metal layer may be formed so as to be in contact with the gate electrode to form a region including the metal compound in part of the gate electrode.

According to an embodiment of the present invention, in the method for manufacturing a semiconductor device, an impurity element imparting conductivity may be added at a concentration of higher than or equal to $1\times10^{19}$ cm$^{-3}$ and lower than or equal to $1\times10^{21}$ cm$^{-3}$ to form the conductive region.

According to an embodiment of the present invention, in the method for manufacturing a semiconductor device, an impurity element imparting conductivity may be added at a concentration of higher than or equal to $1\times10^{19}$ cm$^{-3}$ and lower than or equal to $1\times10^{21}$ cm$^{-3}$ to form a low concentration region that is part of the conductive region, and an impurity element imparting conductivity may be added at a concentration higher than the low concentration region to form a high conductive region that is part of the conductive region.

According to an embodiment of the present invention, in the method for manufacturing a semiconductor device, the metal layer may be formed also in a region not overlapping with the conductive region.

According to an embodiment of the present invention, in the method for manufacturing a semiconductor device, a region including the semiconductor material may be formed over an insulating layer.

According to an embodiment of the present invention, in the method for manufacturing a semiconductor device, a semiconductor film to be a semiconductor material may be formed over a base substrate with an insulating layer provided therebetween by bonding a bond substrate irradiated with $H_3^+$ ions to the base substrate with the insulating layer provided therebetween and by separating a film that is part of the bond substrate from the bond substrate so that the film that is part of the bond substrate may be formed over the base substrate.

According to an embodiment of the present invention, in the method for manufacturing a semiconductor device, the base substrate may be any one of a glass substrate, a single crystal silicon substrate, a polycrystalline silicon substrate, or a solar grade silicon substrate.

With an embodiment of the present invention, the resistance of each member included in a transistor can be reduced, and thus, ON current of the transistor can be improved. Further, with an embodiment of the present invention, the resistance of each member included in a transistor can be reduced, and thus, ON current of the transistor can be improved and performance of an integrated circuit can be improved.

BRIEF DESCRIPTION OF THE DRAWINGS

In the accompanying drawings:

FIGS. 20A, 20B-1, 20B-2, 20B-3, 20C, 20D, and 20E are drawings for illustrating a semiconductor device according to an embodiment of the present invention.

DETAILED DESCRIPTION OF THE INVENTION

Figure 1A:
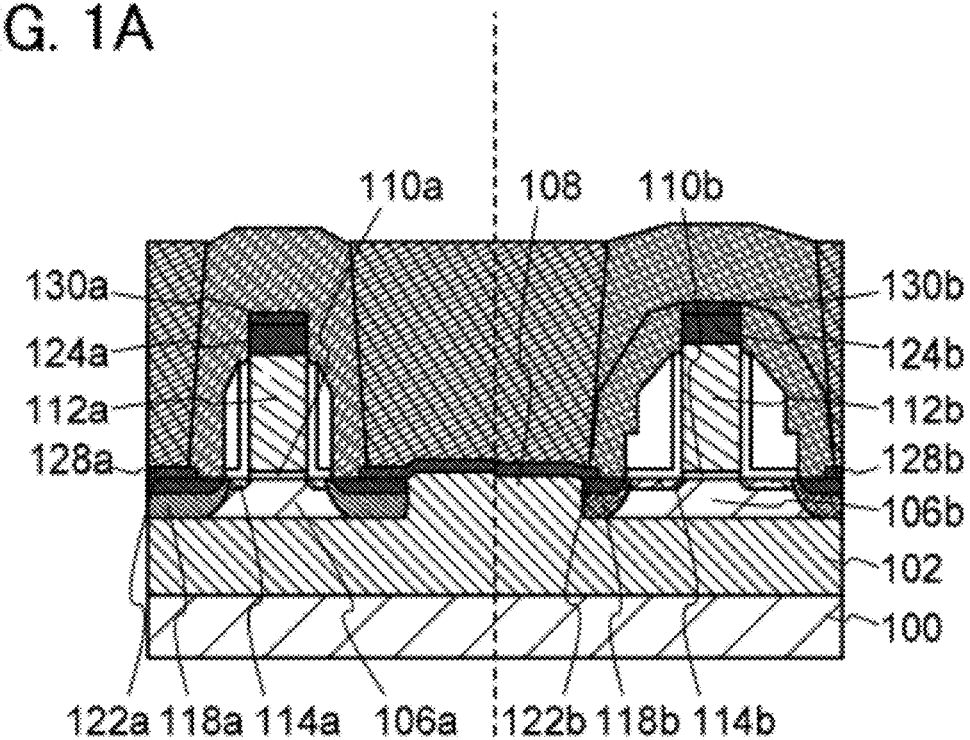
FIGS. 1A and 1B are drawings for illustrating semiconductor devices according to an embodiment of the present invention.

Hereinafter, examples of embodiments of the present invention will be described with reference to drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments.

Note that the size, the thickness of a layer, and a region of each structure illustrated in the drawings and the like in the embodiments are exaggerated for simplicity in some cases. Therefore, the embodiments of the present invention are not limited to such scales.

Note that the numeral terms such as "first", "second", and "third" in this specification are used in order to avoid confusion between components and do not set a limitation on number.

Embodiment 1

In this embodiment, a structure of a semiconductor device according to an embodiment of the disclosed invention is described with reference to FIGS. 1A and 1B and FIGS. 2A and 2B.

FIG. 1A illustrates an example of a semiconductor device including an n-channel FET and a p-channel FET which are provided over a single crystal semiconductor substrate 100 with an insulating layer 102 provided therebetween and are isolated by an element isolation insulating layer 108. The semiconductor device includes channel formation regions formed in a single crystal semiconductor layer 106a and a single crystal semiconductor layer 106b, conductive regions which are in contact with the channel formation regions and each of which includes a semiconductor material, a metal compound region 122a and a metal compound region 122b which are in contact with the conductive regions and each of which includes a metal compound of the semiconductor material, a metal region 128a and a metal region 128b which are in contact with the metal compound region 122a and the metal compound region 122b, a gate insulating layer 110a and a gate insulating layer 110b which are in contact with the channel formation regions, a gate electrode 112a and a gate electrode 112b which are in contact with the gate insulating layer 110a and the gate insulating layer 110b, and source or drain electrodes each of which partly includes either the metal region 128a or the metal region 128b. Further, a metal element included in the metal compound is the same as a metal element included in each of the metal region 128a and the metal region 128b.

Further, in the n-channel FET and the p-channel FET which are illustrated in FIG. 1A, part of the gate electrode 112a includes a metal compound region 124a and part of the gate electrode 112b includes a metal compound region 124b. Further, part of the gate electrode 112a includes a metal region 130a and part of the gate electrode 112b includes a metal region 130b. Note that in the above description, the channel formation region refers to a region of the single crystal semiconductor layer 106a in the vicinity of the interface with the gate insulating layer 110a, or refers to a region of the single crystal semiconductor layer 106b in the vicinity of the interface with the gate insulating layer 110b.

Note that the conductive regions may include a low conductive region 114a and a low conductive region 114b (also referred to as first conductive regions) in contact with the channel formation regions and may include a high conductive region 118a and a high conductive region 118b (also referred to as second conductive regions) in contact with the low conductive region 114a and the low conductive region 114b. In this case, the concentration of an impurity element imparting conductivity which is added to the low conductive region 114a and the low conductive region 114b is preferably higher than or equal to $1 \times 10^{19}$ cm$^{-3}$ and lower than or equal to $1 \times 10^{21}$ cm$^{-3}$, and the concentration of an impurity element imparting conductivity which is added to the high conductive region 118a and the high conductive region 118b is preferably higher than the concentration of the low conductive region 114a. Further, the metal region 128a and the metal region 128b can be provided in a region not overlapping with the conductive regions. In this case, the accuracy needed for the alignment of contact can be reduced; therefore, it is advantageous in terms of a manufacturing process of an FET.

Note that FIG. 1A has a structure in which the metal region 128a and the metal region 128b do not exist over part of the metal compound region 122a and the metal compound region 122b. However, an embodiment of the disclosed invention is not limited thereto. FIG. 1A may have a structure in which the metal region 128a and the metal region 128b exist over the entire surface of an upper portion of the metal compound region 122a and the metal compound region 122b. The difference between the structures is caused also by the patterning accuracy of a metal layer. Therefore, these structures are not limited in particular.

Figure 1B:
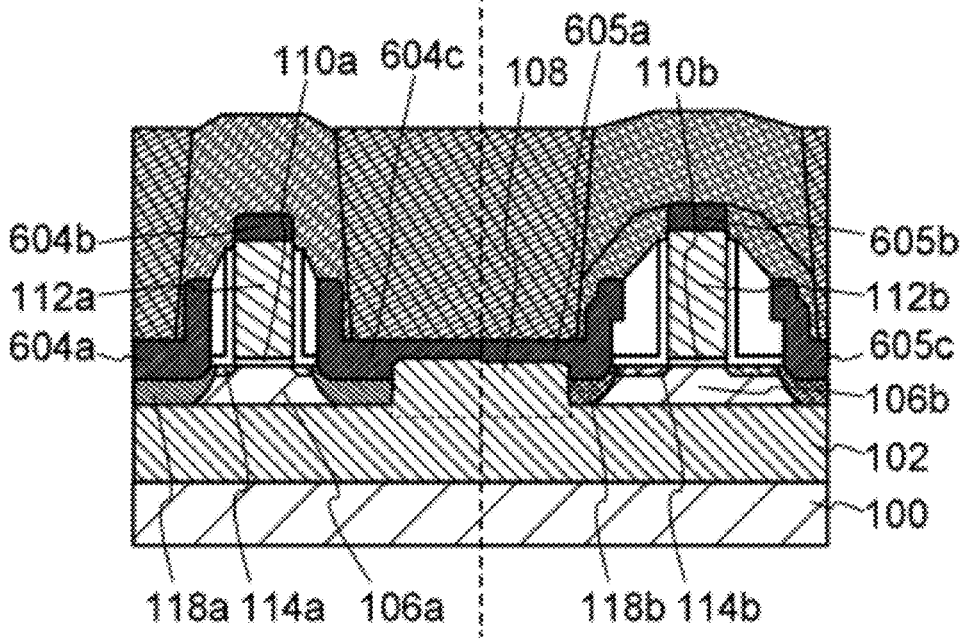

FIG. 1B illustrates another example of a semiconductor device including an n-channel FET and a p-channel FET. The semiconductor device includes the channel formation regions formed in the single crystal semiconductor layer 106a and the single crystal semiconductor layer 106b, the conductive regions which are in contact with the channel formation regions and each of which includes a semiconductor material, a metal region 604a, a metal region 604c, a metal region 605a, and a metal region 605c which are in contact with the conductive regions, the gate insulating layer 110a and the gate insulating layer 110b which are in contact with the channel formation regions, the gate electrode 112a and the gate electrode 112b which are in contact with the gate insulating layer 110a and the gate insulating layer 110b, the source or drain electrodes each of which partly includes either the metal region 604a or the metal region 604c, and the source or drain electrodes each of which partly includes either the metal region 605a or the metal region 605c.

Further, in the n-channel FET and the p-channel FET which are illustrated in FIG. 1B, part of the gate electrode 112a includes the metal region 604b and part of the gate electrode 112b includes the metal region 605b. Further, in the above description, the channel formation region refers to a region of the single crystal semiconductor layer 106a in the vicinity of the interface with the gate insulating layer 110a, or refers to a region of the single crystal semiconductor layer 106b in the vicinity of the interface with the gate insulating layer 110b.

Note that the conductive regions may include the low conductive region 114a and the low conductive region 114b in contact with the channel formation regions and may include the high conductive region 118a and the high conductive region 118b in contact with the low conductive region 114a and the low conductive region 114b. In this case, the concentration of an impurity element imparting conductivity which is added to the low conductive region 114a and the low conductive region 114b is preferably higher than or equal to $1 \times 10^{19}$ cm$^{-3}$ and lower than or equal to $1 \times 10^{21}$ cm$^{-3}$, and the concentration of an impurity element imparting conductivity which is added to the high conductive region 118a and the high conductive region 118b is preferably higher than the concentration of the low conductive region 114a.

One different point of the structure illustrated in FIG. 1B from the structure illustrated in FIG. 1A is the existence of the metal compound region. That is, in FIG. 1B, the metal region 604a, the metal region 604c, the metal region 605a, and the metal region 605c are in direct contact with the conductive regions. As described above, in FIG. 1B, the metal region serves as an alternative to the metal compound region. Therefore, the electric resistance can be further reduced as compared to the case of using the metal compound region. That is, with the use of the structure, the characteristics of a semiconductor device can be further improved. Note that the concentration of an impurity added to the conductive region tends to be increased as the miniaturization of an FET proceeds. Thus, the contact resistance between the conductive region and the metal region does not become a major problem.

Further, in the structure illustrated in FIG. 1B, a structure in which part of the single crystal semiconductor layer 106a and part of the single crystal semiconductor layer 106b (part of the conductive regions) are removed (recessed) in order to form the metal regions is used. Thus, a substantial path of current can be shortened, and therefore, the reduction of the electric resistance is realized. That is, with the use of the structure, the characteristics of the semiconductor device can be further improved. Note that the phrase "structure in which part is removed" can be expressed as follows: "the contact interface between the gate insulating layer and the single crystal semiconductor layer (channel formation region) exists above the contact interface between the metal region and the single crystal semiconductor layer (conductive region) (here, a surface of the single crystal semiconductor substrate 100 is regarded as a reference level)".

Further, in the above structure, the metal region does not necessarily include metal as its main component. The metal region may be formed using any material as long as a given condition (for example, a condition where the conductivity of the metal region is higher than the conductivity of a compound of a semiconductor material with metal) is satisfied. In this sense, the metal region can be referred to as a conduction region, for example.

Note that, there is no need for limiting the structure such as the shape of the metal region 604a, the metal region 604b, the metal region 604c, the metal region 605a, the metal region 605b, and the metal region 605c in FIG. 1B in particular.

Figure 2A:
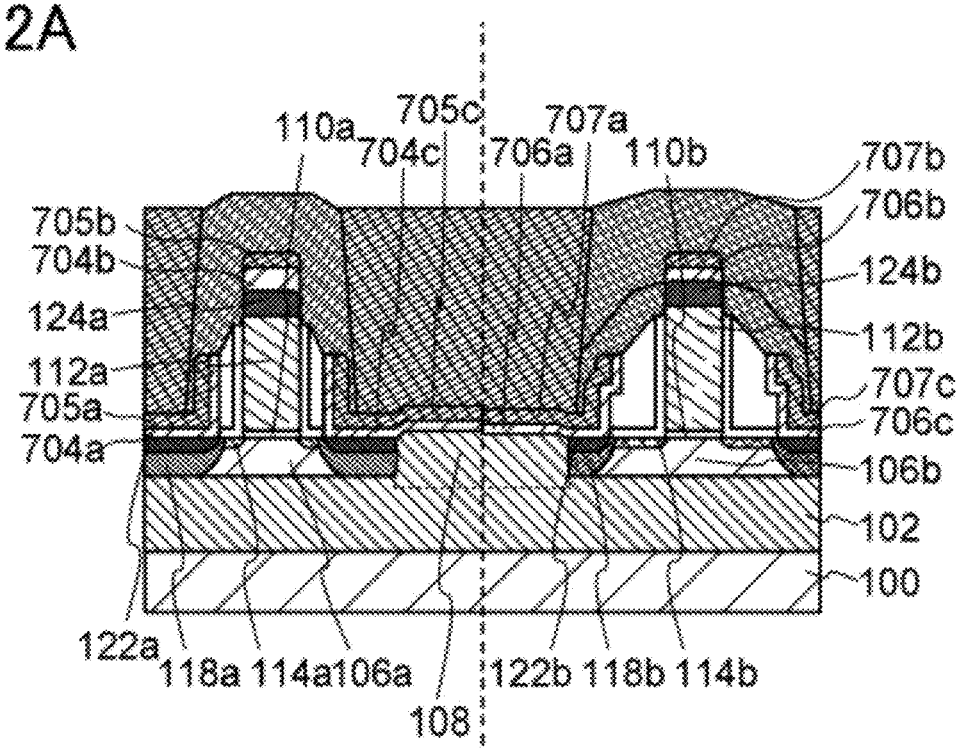
FIGS. 2A and 2B are drawings for illustrating semiconductor devices according to an embodiment of the present invention.

FIG. 2A illustrates another example of a semiconductor device including an n-channel FET and a p-channel FET. The structure of the semiconductor device is almost the same as the structure of the semiconductor device relating to FIG. 1A.

A typical different point of the structure illustrated in FIG. 2A from the structure illustrated in FIG. 1A is as follows: a second metal region 705a, a second metal region 705b, a second metal region 705c, a second metal region 707a, a second metal region 707b, and a second metal region 707c are stacked over a first metal region 704a, a first metal region 704b, a first metal region 704c, a first metal region 706a, a first metal region 706b, and a first metal region 706c, respectively. Note that, also in the structure, the metal region does not necessarily include metal as its main component. The metal region may be formed using any material as long as a given condition (for example, a condition where the conductivity of the metal region is higher than the conductivity of a compound of a semiconductor material with metal) is satisfied. In this sense, the metal region can be referred to as a conduction region, for example.

Figure 2B:
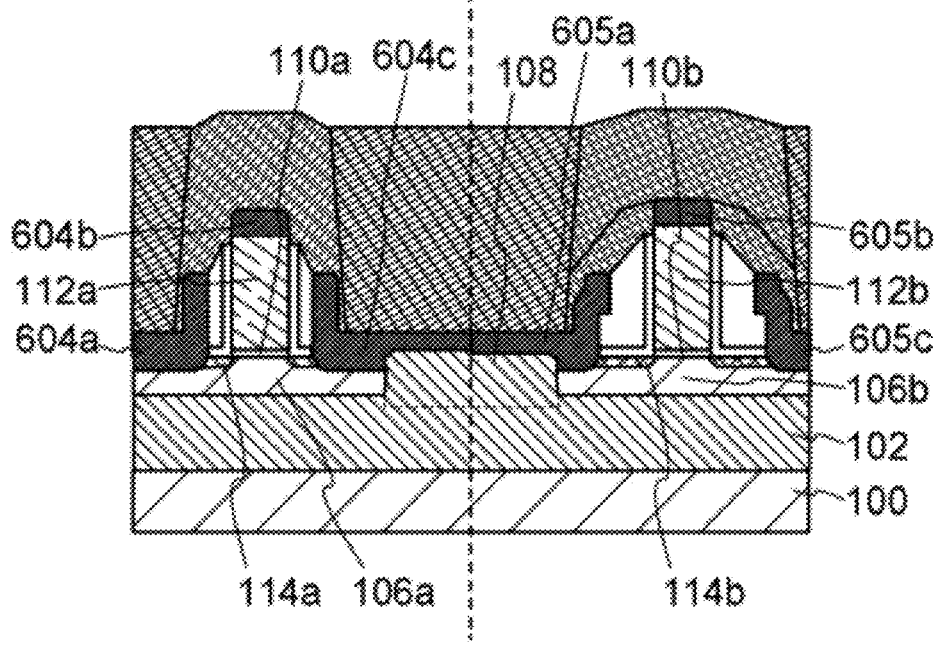

FIG. 2B illustrates another example of a semiconductor device including an n-channel FET and a p-channel FET. The structure of the semiconductor device is almost the same as the structure of the semiconductor device relating to FIG. 1B.

A typical different point of the structure illustrated in FIG. 2B from the structure illustrated in FIG. 1B is that the conductive regions are formed of only conductive regions with shallow junctions (regions corresponding to the low conductive region 114a and the low conductive region 114b in FIG. 1B). That is, in FIG. 2B, the high conductive region 118a and the high conductive region 118b are not formed and the conductive regions are in direct contact with the metal region 604a, the metal region 604c, the metal region 605a, and the metal region 605c. Thus, a manufacturing process of an FET can be simplified while the characteristics of the FET are improved. Here, in the case where the concentration of an impurity added to the conductive regions is low, the contact resistance between the conductive regions and the metal regions might become a problem. However, the problem can be solved by increasing the concentration of an impurity to be added.

Further, also in the above structure, the metal region does not necessarily include metal as its main component. The metal region may be formed using any material as long as a given condition (for example, a condition where the conductivity of the metal region is higher than the conductivity of a compound of a semiconductor material with metal) is satisfied. In this sense, the metal region can be referred to as a conduction region, for example.

Note that the structure relating to this embodiment can be combined as appropriate with any of the structures relating to the other embodiments.

Embodiment 2

In this embodiment, a method for manufacturing a semiconductor device using an SOI substrate will be described. Here, as a typified example of a semiconductor element included in a semiconductor device, a case of manufacturing an n-channel FET and a p-channel FET will be described with reference to FIGS. 3A to 3D, FIGS. 4A to 4D, and FIGS. 5A and 5B.

Figure 3A:
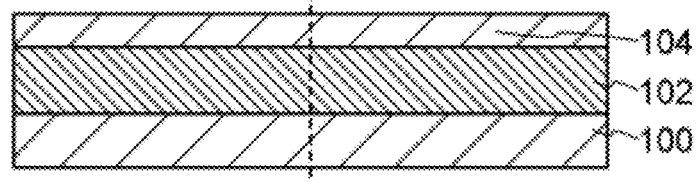
FIGS. 3A to 3D are drawings for illustrating a semiconductor device according to an embodiment of the present invention.
Figure 3B:
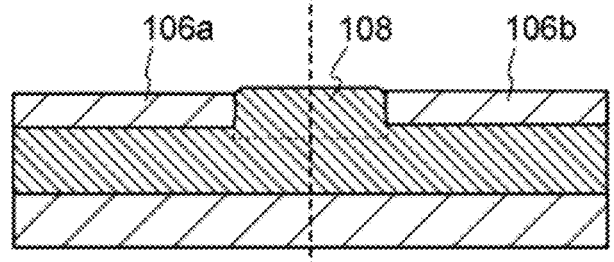
Figure 3C:
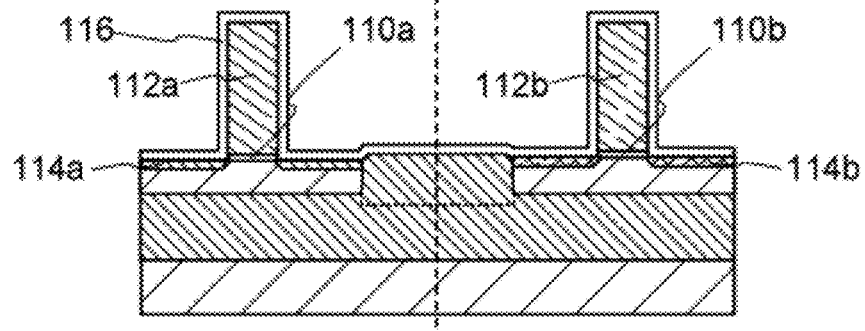

First, an SOI substrate is prepared (see FIG. 3A). In this embodiment, an SOI substrate in which a single crystal semiconductor layer 104 is formed over the single crystal semiconductor substrate 100 with the insulating layer 102 provided therebetween is employed; however, the structure of the SOI substrate that can be used in an embodiment of the disclosed invention is not limited to this structure. For example, an SOI substrate in which a single crystal semiconductor layer is formed over an insulating substrate such as a glass substrate with an insulating layer provided therebetween may be used. In addition, the semiconductor layer formed over the insulating layer is not limited to a single crystal semiconductor layer, and a polycrystalline semiconductor layer, a microcrystalline semiconductor layer, or the like may be used. For example, it is preferable that the insulating layer 102 be formed using oxide of a semiconductor, but the material is not limited thereto. Note that when oxide is used for the insulating layer 102, the insulating layer 102 is called a buried oxide (BOX) layer in some cases.

A protective layer that serves as a mask for forming an element isolation insulating layer is formed over the single crystal semiconductor layer 104 (not shown). As the protective layer, for example, an insulating layer formed using silicon oxide, silicon nitride, or the like can be used. Note that before or after this step, an impurity imparting p-type conductivity may be added to the single crystal semiconductor layer 104 in order to control the threshold voltage. When the single crystal semiconductor layer 104 is formed using silicon, boron, aluminum, gallium, or the like can be used as the impurity imparting p-type conductivity. Similarly, before or after this step, an impurity imparting n-type conductivity may be added to the single crystal semiconductor layer 104 in order to control the threshold voltage. When the single crystal semiconductor layer 104 is formed using silicon, phosphorus, arsenic, or the like can be used as the impurity imparting n-type conductivity. In the case of adding the impurity imparting p-type conductivity as an impurity, for example, boron can be added at a concentration of greater than or equal to $5\times10^{17}$ cm$^{-3}$ and less than $1\times10^{19}$ cm$^{-3}$.

Next, a region of the single crystal semiconductor layer 104 which is not covered with the protective layer (exposed region) and part of the insulating layer 102 are etched using the protective layer as a mask. Thus, the single crystal semiconductor layer 106a and the single crystal semiconductor layer 106b are formed. As the etching, dry etching is preferably performed, but wet etching can be performed. An etching gas and an etchant can be selected as appropriate depending on a material of layers to be etched.

Next, an insulating layer formed using a material that is the same or substantially the same as the material of the insulating layer 102 is formed to cover the single crystal semiconductor layers 106a and 106b and the insulating layer 102 after the etching. For example, when the insulating layer 102 is formed using silicon oxide, it is preferable that the above-mentioned insulating layer be also formed using silicon oxide. The above-mentioned insulating layer can be formed by a chemical vapor deposition method, for example. It is preferable that the above-mentioned insulating layer be deposited thickly so as to cover the single crystal semiconductor layers 106a and 106b. After that, the insulating layer in a region which overlaps with the insulating layers 106a and 106b is removed, and the protective layer is removed; thus, the element isolation insulating layer 108 is left (see FIG. 3B). As a method for removing the insulating layer, there are etching treatment and polishing treatment such as CMP, and any method thereof can be employed.

Next, an insulating layer is formed over the single crystal semiconductor layers 106a and 106b, and a layer including a conductive material is formed over the insulating layer.

For the insulating layer which serves later as a gate insulating layer, a single-layer structure or a stacked-layer structure of films including silicon oxide, silicon nitride oxide, silicon nitride, hafnium oxide, aluminum oxide, tantalum oxide, or the like may be employed. Alternatively, the surfaces of the single crystal semiconductor layers 106a and 106b are oxidized or nitrided by high-density plasma treatment or thermal oxidation treatment; thus, the insulating layer may be formed. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer, but the insulating layer can be formed in the range of greater than or equal to 1 nm and less than or equal to 100 nm, for example.

The layer including a conductive material can be formed using a semiconductor material such as polysilicon containing a conductive material. Alternatively, the layer including a conductive material may be formed using a metal material, such as aluminum, copper, titanium, tantalum, or tungsten. There is also no particular limitation on the method for forming the layer including a conductive material, and a variety of film formation methods, such as a CVD method, a sputtering method, an evaporation method, or a spin coating method can be employed. Note that the case of forming the layer including a conductive material using a semiconductor material is described in this embodiment.

After that, the insulating layer and the layer including a conductive material are etched using a mask to form the gate insulating layer 110a, the gate insulating layer 110b, the gate electrode 112a, and the gate electrode 112b.

Next, an insulating layer 116 that covers the gate electrodes 112a and 112b is formed. Then, phosphorus (P), arsenic (As), or the like is added to form the low conductive region 114a with a shallow junction depth in a region to be an n-channel FET; and boron (B), aluminum (Al), or the like is added to form the low conductive region 114b with a shallow junction depth in a region to be a p-channel FET (see FIG. 3C). Here, the concentrations of the added impurity can be set as appropriate, and the concentrations are preferably set to be high in accordance with miniaturization of semiconductor elements. Although a step in which the low conductive regions 114a and 114b are formed after the formation of the insulating layer 116 is employed here, the insulating layer 116 may be formed after the formation of the low conductive regions 114a and 114b.

Next, a sidewall insulating layer 116a and a sidewall insulating layer 116b are formed. The sidewall insulating layer 116b in the region to be a p-channel FET is preferably thicker than the sidewall insulating layer 116a in the region to be an n-channel FET. At this time, the insulating layer 116 is partly etched so that top surfaces of the gate electrodes 112a and 112b and top surfaces of the low conductive regions 114a and 114b are exposed (see FIG. 3D).

Next, an insulating layer is formed to cover the gate electrodes 112a and 112b, the low conductive regions 114a and 114b, the sidewall insulating layers 116a and 116b, and the like. Then, phosphorus (P), arsenic (As), or the like is added to a region adjacent to the low conductive region 114a in the region to be an n-channel FET; thus, the high conductive region 118a is formed, and boron (B), aluminum (Al), or the like is added to a region adjacent to the low conductive region 114b of in the region to be an p-channel FET; thus, the high conductive region 118b are formed. After that, the insulating layer is removed, and then a metal layer 120 which covers the gate electrodes 112a and 112b, the sidewall insulating layers 116a and 116b, the high conductive regions 118a and 118b, and the like is formed (see FIG. 4A). A variety of methods, such as a sputtering method, an evaporation method, or a spin coating method, can be employed for formation of the metal layer 120. It is preferable that the metal layer 120 be formed using a metal material that reacts with a semiconductor material included in the single crystal semiconductor layers 106a and 106b to be a metal compound having low resistance. Examples of such metal materials include titanium, tantalum, tungsten, nickel, cobalt, and platinum.

Next, heat treatment is performed, so that the metal layer 120 reacts with the semiconductor material. Thus, the metal compound region 122a which is in contact with the high conductive region 118a and the metal compound region 122b which is in contact with the high conductive region 118b are formed along with the metal compound region 124a in part of the gate electrode 112a and the metal compound region 124b in part of the gate electrode 112b (see FIG. 4B). As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that since the metal compound regions are formed by reaction of the metal material and the semiconductor material, the conductivity of the metal compound regions is higher than that of the second conductive regions. The formation of the metal compound regions can properly reduce electric resistance of the FETs and improve element characteristics.

Figure 4A:
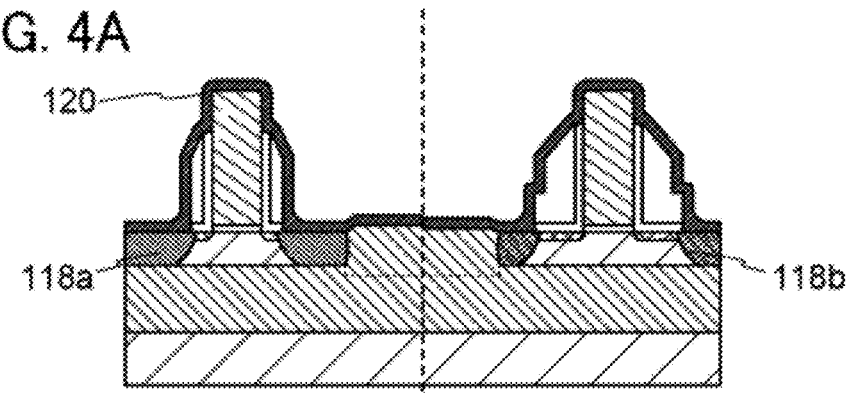
FIGS. 4A to 4D are drawings for illustrating a semiconductor device according to an embodiment of the present invention.
Figure 4B:
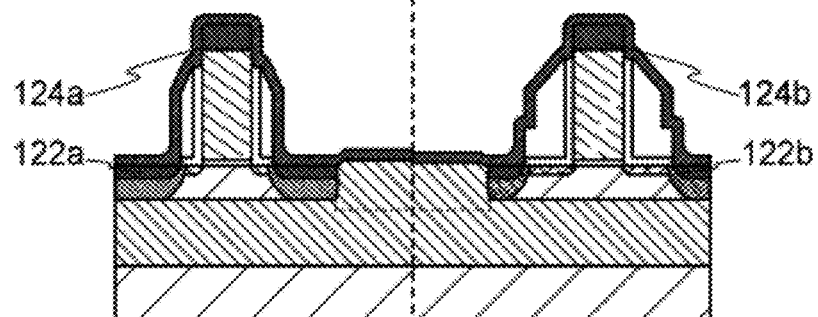
Figure 4C:
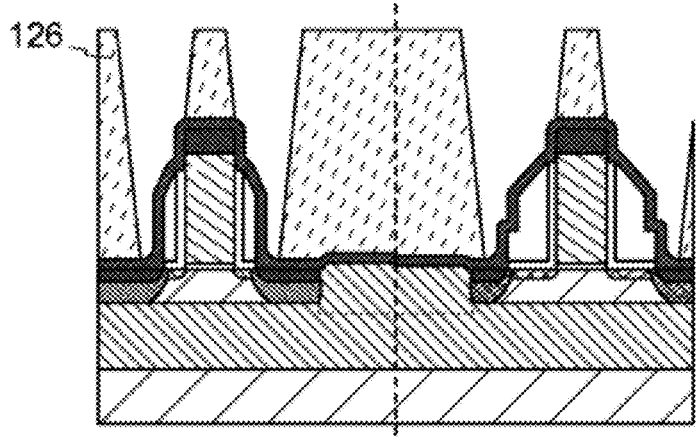
Figure 4D:
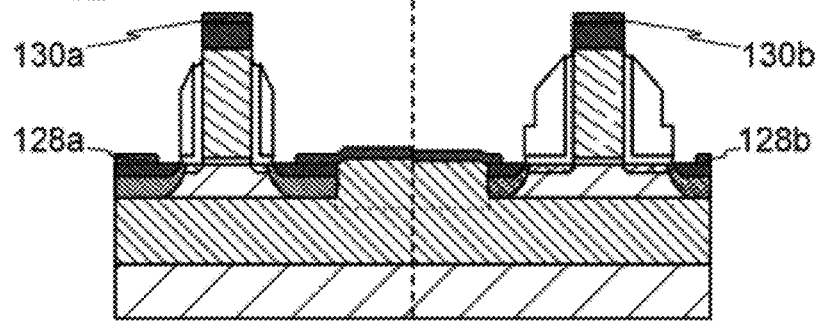

Next, a mask 126 having a desired shape is formed using a resist material or the like (see FIG. 4C). The metal layer 120 is etched using the mask 126 to form the metal regions 128a, 128b, 130a, and 130b which each serve as part of an electrode (or a wiring) (see FIG. 4D). As the etching, either dry etching or wet etching may be employed. Here, the metal regions 128a and 128b each serve as part of a source electrode (or a wiring) or part of a drain electrode (or a wiring). Further, the metal regions 130a and 130b each serve as part of a gate electrode (or a wiring). Note that a step of forming the metal regions 128a and 128b and the metal regions 130a and 130b is described in this embodiment, but an embodiment of the disclosed invention is not limited to this structure. For example, a structure in which the metal regions 128a and 128b are formed but the metal regions 130a and 130b are not formed, or a structure in which the metal regions 130a and 130b are formed but the metal regions 128a and 128b are not formed may be employed. In terms of reduction in electric resistance of the elements, a certain effect can be obtained when any of the metal regions is formed.

Figure 5A:
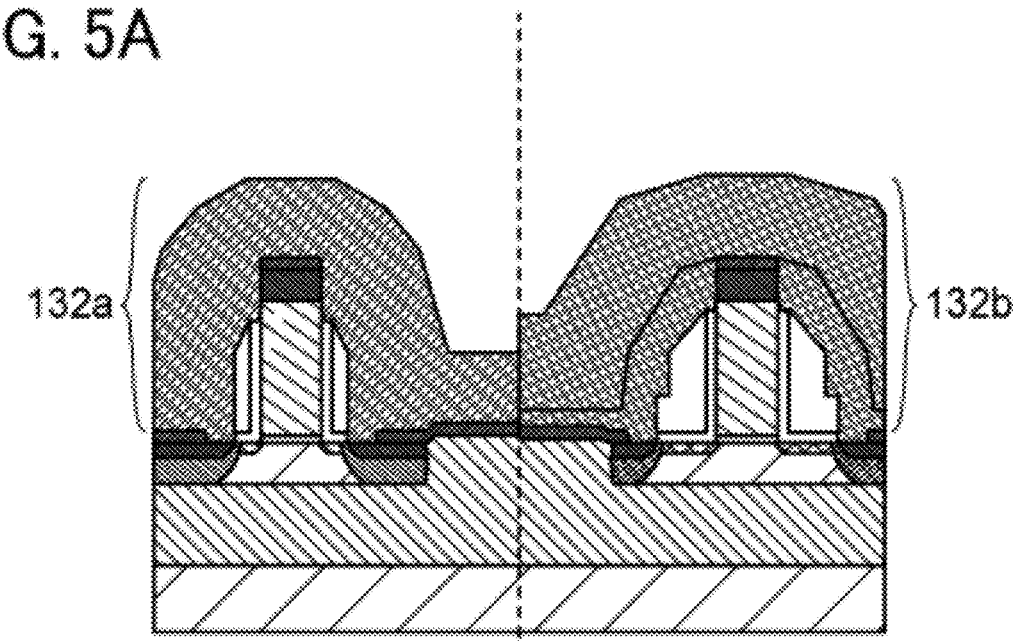
FIGS. 5A and 5B are drawings for illustrating a semiconductor device according to an embodiment of the present invention.

An interlayer insulating layer 132a and an interlayer insulating layer 132b are formed so as to cover each of the components formed in the above steps (see FIG. 5A). The interlayer insulating layers 132a and 132b can be formed using a material including an inorganic insulating material, such as silicon oxide, silicon nitride oxide, silicon nitride, hafnium oxide, aluminum oxide, or tantalum oxide. Alternatively, an organic insulating material such as polyimide or acrylic may be used. Note that here, the interlayer insulating layer 132a having a single-layer structure is formed in the region to be an n-channel FET and the interlayer insulating layer 132b having a two-layer structure is formed in the region to be a p-channel FET; however, an embodiment of the disclosed invention is not limited to this structure.

After that, an opening that reaches the metal regions 128a and 128b and the metal regions 130a and 130b is formed in the interlayer insulating layer, and a conductive layer serving as an electrode (or a wiring) is formed in the opening. Although only a conductive layer 134a in contact with the metal region 128a and a conductive layer 134b in contact with the metal region 128b are described here, a conductive layer in contact with the metal region 130a and a conductive layer in contact with the metal region 130b can be formed simultaneously in this step (see FIG. 5B). There is no particular limitation on a material for forming the conductive layers 134a and 134b, and a variety of conductive materials can be used.

Through the above process, the semiconductor device including an n-channel FET and a p-channel FET can be manufactured. Note that as a structure of the wiring, a multilayer wiring structure in which an interlayer insulating layer and a conductive layer are stacked may be adopted. Adoption of the multilayer wiring structure enables to provide a highly-integrated semiconductor device. Although an SOI substrate is used as the substrate over which the FET is formed in this embodiment, an embodiment of the disclosed invention is not limited to an SOI substrate. The above FET can be formed using a single crystal semiconductor substrate such as a silicon substrate, a polycrystalline semiconductor substrate, or the like.

In an embodiment of the disclosed invention, the metal layer used for forming the metal compound region is used as part of the electrode (or the wiring) of the FET. Thus, electric resistance can be properly controlled, so that a preferable semiconductor element can be provided. When the metal layer is left at the time of forming an opening in the interlayer insulating layer, defects caused by over-etching a thin single crystal semiconductor layer in an etching step can be reduced, which is advantageous to the manufacturing process.

Note that the structures according to this embodiment can be combined as appropriate with any structure of the other embodiments.

Embodiment 3

In this embodiment, a method for manufacturing a semiconductor device using an SOI substrate will be described. Here, as a typified example of a semiconductor element included in a semiconductor device, an example of manufacturing an n-channel FET and a p-channel FET will be described with reference to FIGS. 6A to 6C and FIGS. 7A to 7C. Note that a method for manufacturing the semiconductor device illustrated in FIG. 1B of Embodiment 1 will be described in this embodiment. The description that overlaps with the description of the method for manufacturing the semiconductor device using an SOI substrate described in Embodiment 2 is omitted and the description of Embodiment 2 is employed.

Figure 3D:
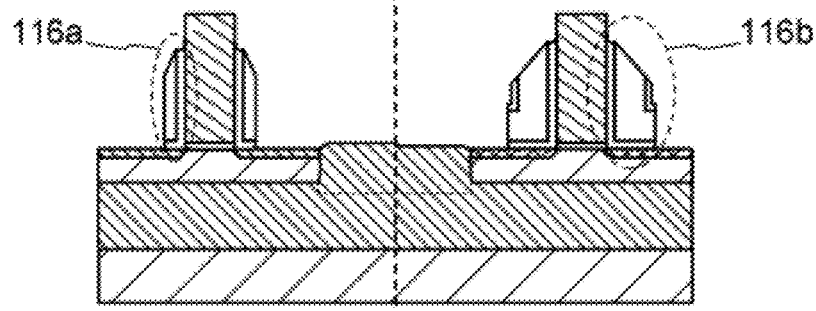
Figure 6A:
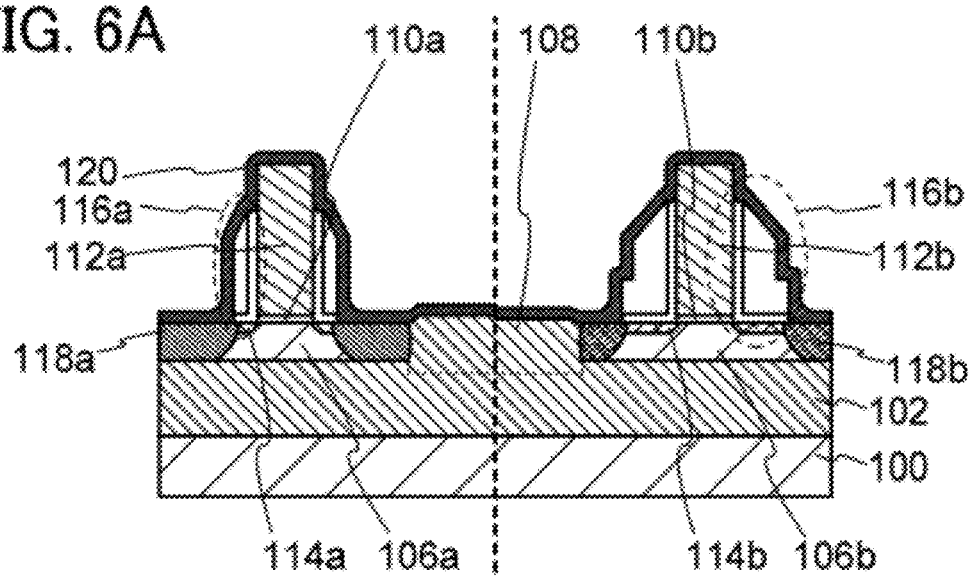
FIGS. 6A to 6C are drawings for illustrating a semiconductor device according to an embodiment of the present invention.
Figure 6B:
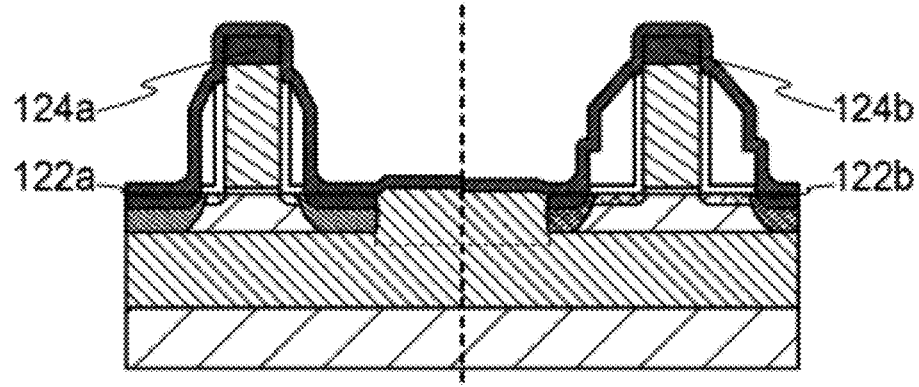

First, the high conductive regions 118a and 118b and the metal layer 120 are formed in a manner similar to that of FIGS. 3A to 3D of Embodiment 2, so that a state which is the same as a state of FIG. 4A is obtained (see FIG. 6A). Next, the metal compound regions 122a and 122b, and the metal compound regions 124a and 124b are formed in a manner similar to that of FIG. 4B, so that a state illustrated in FIG. 6B is obtained (see FIG. 6B).

Figure 6C:
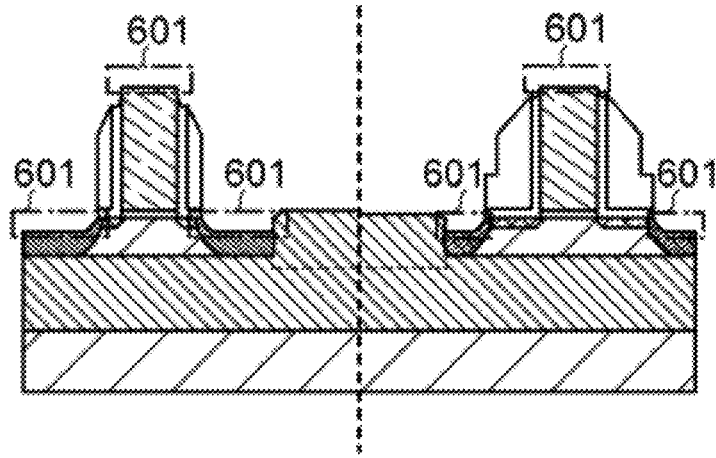

Then, the metal layer 120, the metal compound regions 122a and 122b, and the metal compound regions 124a and 124b are etched so that regions surrounded by dotted lines 601 are exposed (see FIG. 6C). As the etching, either dry etching or wet etching may be employed. The surfaces of the high conductive regions 118a and 118b are removed and the regions surrounded by the dotted lines 601 are formed by the etching, whereby a contact area of the high conductive regions 118a and 118b with a wiring layer that is formed later can be increased.

Next, a metal layer 602 is formed to cover the gate electrodes 112a and 112b, the high conductive regions 118a and 118b, the sidewall insulating layers 116a and 116b, and the like. Next, a mask 603 having a desired shape is formed using a resist material or the like (see FIG. 7A). The metal layer 602 is etched using the mask 603 to form the metal regions 604a to 604c and the metal regions 605a to 605c which each serve as part of an electrode (or a wiring) (see FIG. 7B). Note that a variety of methods, such as a sputtering method, an evaporation method, or a spin coating method, can be employed for formation of the metal layer 602 with a single-layer structure or a stacked-layer structure. Examples of metal materials for forming the metal layer 602 include metal such as aluminum, tantalum, titanium, molybdenum, tungsten, nickel, silver, and copper, and alloy of the metal, and a compound of the metal. Specifically, tungsten or molybdenum is suitable for the metal layer 602 because tungsten and molybdenum have a high heat resistance; can be a material whose resistance is lower than resistance of the metal compound regions 122a, 122b, 124a, and 124b; and are suitable for microfabrication or the like. Note that the metal material for forming the metal layer 602 may be metal oxide, metal nitride, or the like as long as it is a material whose resistance is lower than resistance of the metal compound regions 124a and 124b. As the etching, either dry etching or wet etching may be employed. Here, the metal regions 604a and 604c and the metal regions 605a and 605c each serve as part of a source electrode (or a wiring) or part of a drain electrode (or a wiring). In addition, the metal region 604b and the metal region 605b each serve as part of a gate electrode (or a wiring). Note that a step of forming the metal regions 604a to 604c and the metal regions 605a to 605c is described in this embodiment, but an embodiment of the disclosed invention is not limited to this structure. For example, a structure in which the metal regions 604a and 604c and the metal regions 605a and 605c are formed but the metal region 604b and the metal region 605b are not formed may be employed. In terms of reduction in electric resistance of the elements, a certain effect can be obtained when any of the metal regions (604a to 604c and the metal regions 605a to 605c) is formed.

Figure 7A:
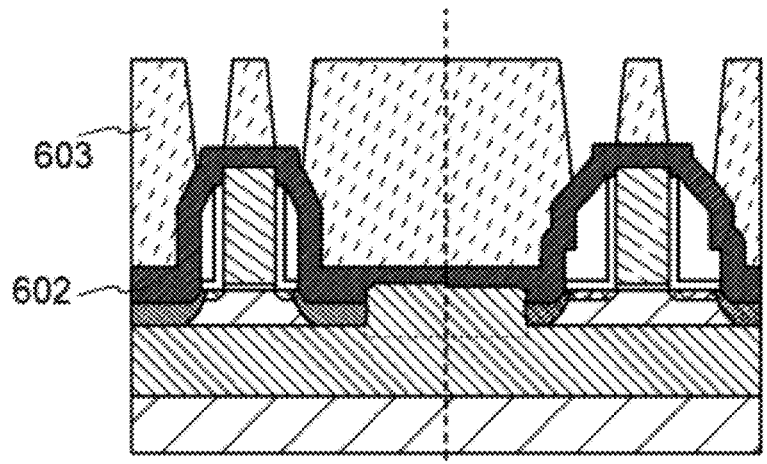
FIGS. 7A to 7C are drawings for illustrating a semiconductor device according to an embodiment of the present invention.
Figure 7B:
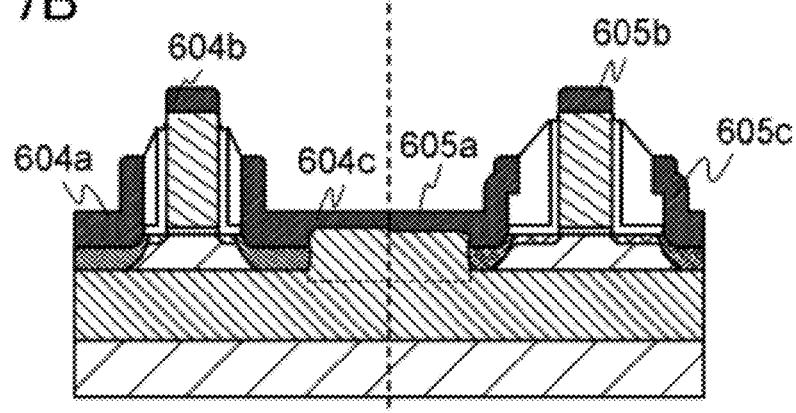

In FIG. 7A, contact interfaces between the gate insulating layers 110a and 110b and the channel formation regions formed in the single crystal semiconductor layers 106a and 106b are formed above contact interfaces between the metal region where the metal layer 602 is formed and the conductive regions where the high conductive regions 118a and 118b are formed. Accordingly, resistance of each of components for forming a transistor can be made small, so that on-current of the transistor can be improved. Further, distance between the source or the drain and the channel can be freely set because of the metal layer 602.

Figure 5B:
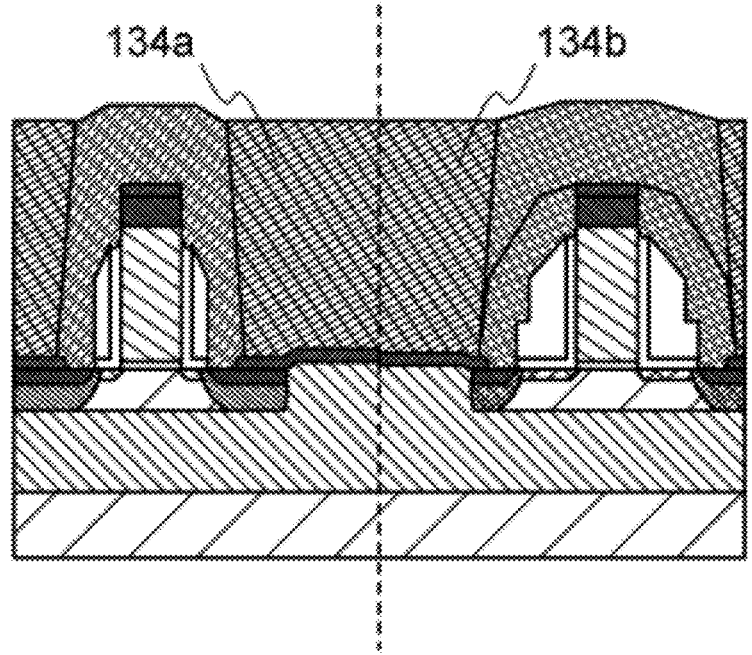
Figure 7C:
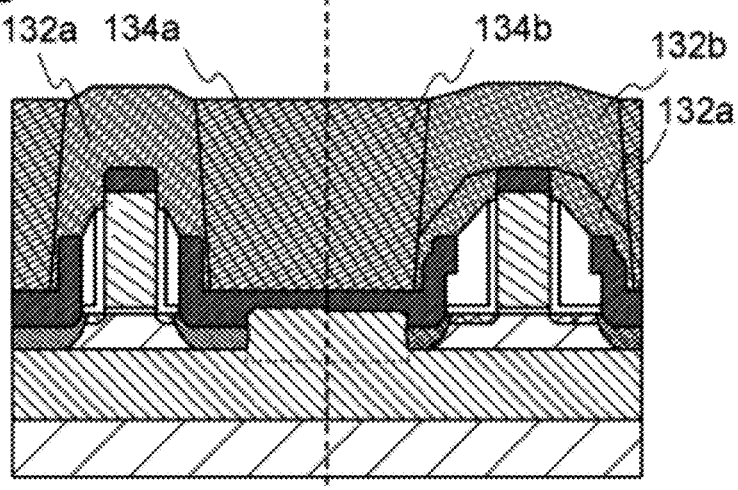

Next, the interlayer insulating layers 132a and 132b and the conductive layers 134a and 134b are formed in a manner similar to that of FIGS. 5A and 5B of Embodiment 2, so that a state illustrated in FIG. 7C is obtained (see FIG. 7C).

Through the above process, the semiconductor device including an n-channel FET and a p-channel FET can be manufactured. Note that as a structure of the wiring, a multi-layer wiring structure in which an interlayer insulating layer and a conductive layer are stacked may be adopted. Adoption of the multilayer wiring structure enables to provide a highly-integrated semiconductor device. Although an SOI substrate is used as the substrate over which the FET is formed in this embodiment, an embodiment of the disclosed invention is not limited to an SOI substrate. The above FET can be formed using a single crystal semiconductor substrate such as a silicon substrate, a polycrystalline semiconductor substrate, or the like.

In an embodiment of the disclosed invention, the metal compound region is removed and a newly-formed metal layer is used as part of the electrode (or the wiring) of the FET. Therefore, the contact area of the metal layer can be increased and electric resistance can be properly controlled, so that a preferable semiconductor element can be provided. When a new metal layer is formed, diffusion of heat generated in the FET can be promoted, whereby decrease in current caused by self-heating can be prevented.

Note that the structures according to this embodiment can be combined as appropriate with any structure of the other embodiments.

Embodiment 4

In this embodiment, a method for manufacturing a semiconductor device using an SOI substrate will be described. Here, as a typified example of a semiconductor element included in a semiconductor device, an example of manufacturing an n-channel FET and a p-channel FET will be described with reference to FIGS. 8A to 8C and FIGS. 9A to 9C. Note that a method for manufacturing the semiconductor device illustrated in FIG. 2A of Embodiment 1 will be described in this embodiment. The description that overlaps with the description of the method for manufacturing the semiconductor device using an SOI substrate described in Embodiment 2 is omitted and the description of Embodiment 2 is employed.

Figure 8A:
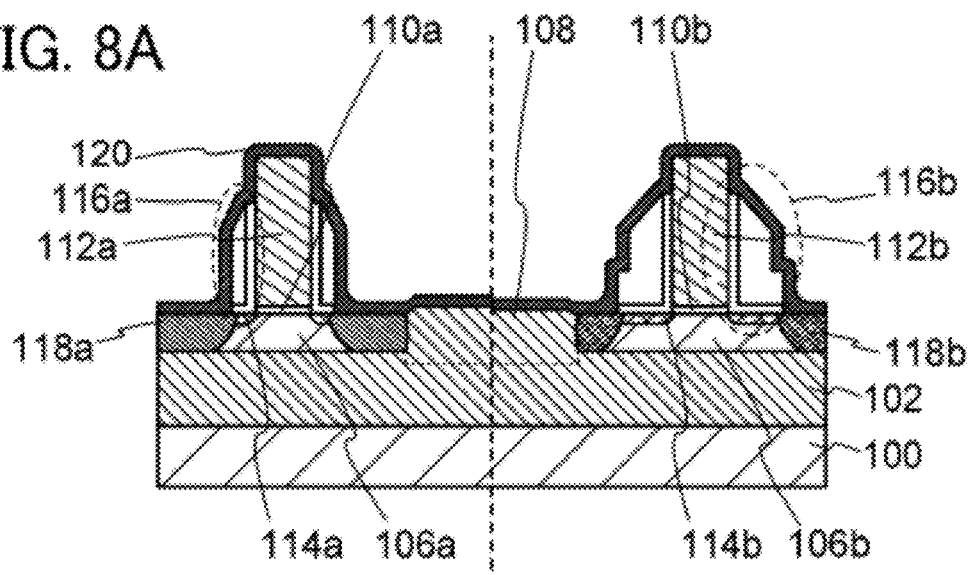
FIGS. 8A to 8C are drawings for illustrating a semiconductor device according to an embodiment of the present invention.
Figure 8B:
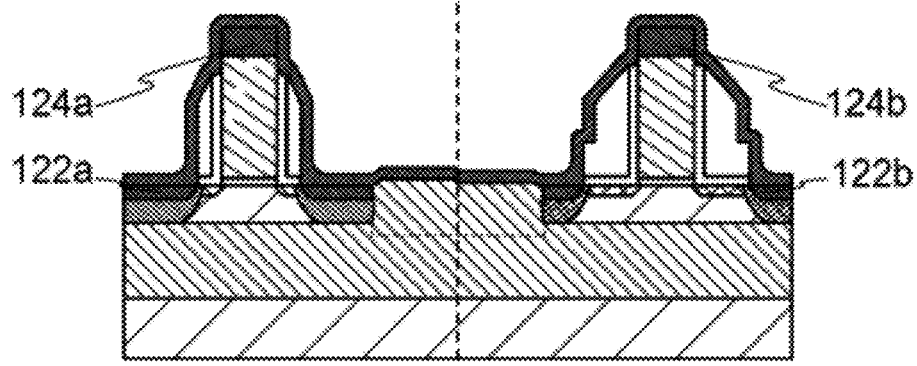

First, the high conductive regions 118a and 118b and the metal layer 120 are formed in a manner similar to that of FIGS. 3A to 3D of Embodiment 2, so that a state which is the same as a state of FIG. 4A is obtained (see FIG. 8A). Next, the metal compound regions 122a and 122b, and the metal compound regions 124a and 124b are formed in a manner similar to that of FIG. 4B, so that a state illustrated in FIG. 8B is obtained (see FIG. 8B).

Figure 8C:
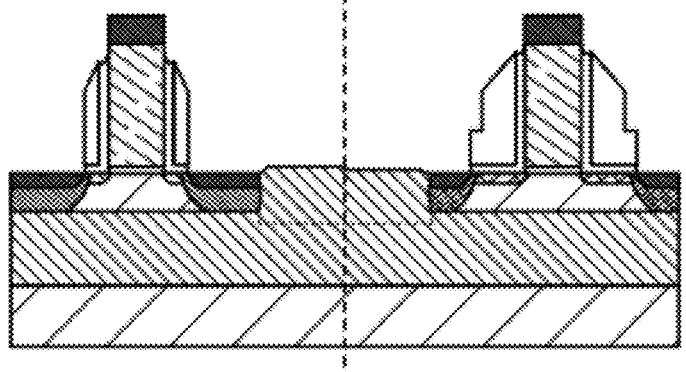

Then, the metal layer 120 is etched so that the metal compound regions 122a and 122b and the metal compound regions 124a and 124b are exposed (see FIG. 8C). As the etching, either dry etching or wet etching may be employed. The surfaces of the high conductive regions 118a and 118b can be cleaned along with removal of the surfaces of the metal compound regions 122a and 122b and the metal compound regions 124a and 124b by the etching, which is preferable.

Next, a first metal layer 701 and a second metal layer 702 are formed to cover the gate electrodes 112a and 112b, the metal compound regions 122a and 122b, the metal compound regions 124a and 124b, the sidewall insulating layers 116a and 116b, and the like. Next, a mask 703 having a desired shape is formed using a resist material or the like (see FIG. 9A). The first metal layer 701 and the second metal layer 702 are etched using the mask 703 to form the first metal regions 704a to 704c, the second metal regions 705a to 705c, the first metal regions 706a to 706c, and the second metal regions 707a to 707c which each serve as part of an electrode (or a wiring) (see FIG. 9B). Note that a variety of methods, such as a sputtering method, an evaporation method, or a spin coating method, can be employed for formation of the first metal layer 701 and the second metal layer 702 with a single-layer structure or a stacked-layer structure. Examples of metal materials for forming the first metal layer 701 include metal such as aluminum, tantalum, titanium, molybdenum, tungsten, nickel, silver, and copper, and a compound such as metal oxide thereof or metal nitride thereof. Examples of metal materials for forming the second metal layer 702 include metal such as aluminum, tantalum, titanium, molybdenum, tungsten, nickel, silver, and copper, and a compound such as metal oxide thereof or metal nitride thereof. Specifically, titanium nitride and tungsten are preferably used for the first metal layer 701 and the second metal layer 702, respectively, because titanium nitride and tungsten have a high heat resistance, and can be a material whose resistance is lower than resistance of the metal compound regions 122a, 122b, 124a, and 124b. Therefore, decrease in contact failures at interfaces between metal layers and the metal compound regions can be achieved, which is preferable. Note that the material for forming the second metal layer 702 may be metal oxide, metal nitride, or the like as long as it is a material whose resistance is lower than resistance of the metal compound regions 124a and 124b. As the etching, either dry etching or wet etching may be employed. Here, the first metal regions 704a and 704c, the second metal regions 705a and 705c, the first metal regions 706a and 706c, and the second metal regions 707a and 707c each serve as part of a source electrode (or a wiring) or part of a drain electrode (or a wiring). In addition, the first metal region 704b, the second metal region 705b, the first metal region 706b, and the second metal region 707b each serve as part of a gate electrode (or a wiring). Note that a step of forming the first metal regions 704a to 704c, the second metal regions 705a to 705c, the first metal regions 706a to 706c, and the second metal regions 707a to 707c is described in this embodiment, but an embodiment of the disclosed invention is not limited to this structure. For example, a structure in which the first metal regions 704a and 704c, the second metal regions 705a and 705c, the first metal regions 706a and 706c, and the second metal regions 707a and 707c are formed but the first metal region 704b, the second metal region 705b, the first metal region 706b, and the second metal region 707b are not formed may be employed. In terms of reduction in electric resistance of the elements, a certain effect can be obtained when any of the metal regions (the first metal regions 704a to 704c, the second metal regions 705a to 705c, the first metal regions 706a to 706c, and the second metal regions 707a to 707c) are formed.

Figure 9A:
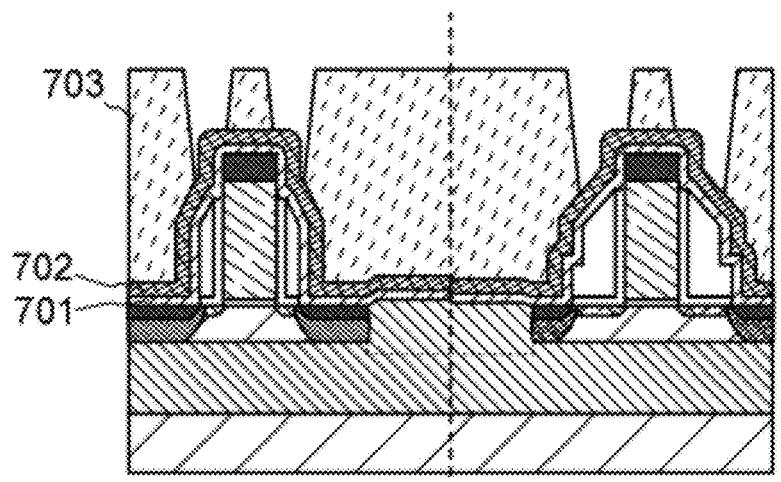
FIGS. 9A to 9C are drawings for illustrating a semiconductor device according to an embodiment of the present invention.
Figure 9B:
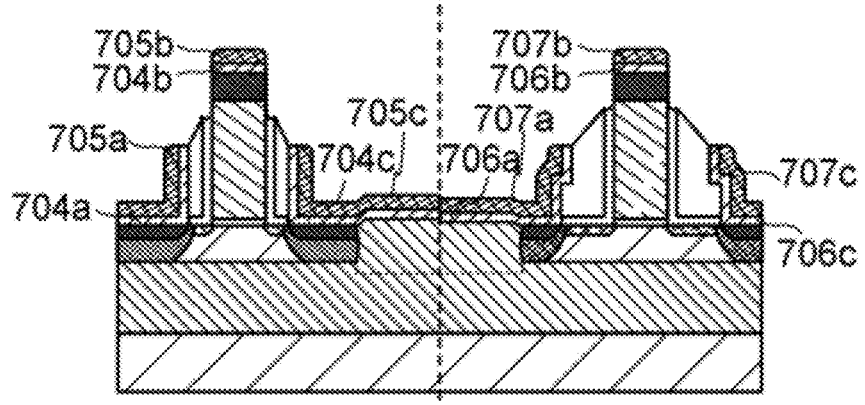
Figure 9C:
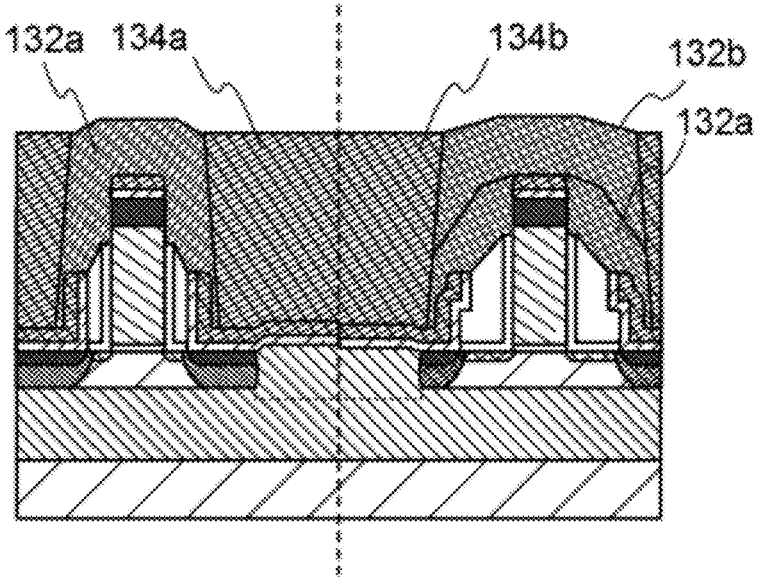

Next, the interlayer insulating layers 132a and 132b and the conductive layers 134a and 134b are formed in a manner similar to that of FIGS. 5A and 5B of Embodiment 2, so that a state illustrated in FIG. 9C is obtained (see FIG. 9C).

Through the above process, the semiconductor device including an n-channel FET and a p-channel FET can be manufactured. Note that as a structure of the wiring, a multilayer wiring structure in which an interlayer insulating layer and a conductive layer are stacked may be adopted. Adoption of the multilayer wiring structure enables to provide a highly-integrated semiconductor device. Although an SOI substrate is used as the substrate over which the FET is formed in this embodiment, an embodiment of the disclosed invention is not limited to an SOI substrate. The above FET can be formed using a single crystal semiconductor substrate such as a silicon substrate, a polycrystalline semiconductor substrate, or the like.

In an embodiment of the disclosed invention, a wiring layer, which serves as part of the source electrode (or the wiring), part of the drain electrode (or the wiring), and part of the gate electrode (or the wiring), is formed to have a stacked-layer structure of a conductive layer and a metal layer. The wiring layer is used as part of the electrode (or the wiring) of the FET. Thus, the contact area of the electrode (or the wiring) of the FET with the conductive layers 134a and 134b can be increased and electric resistance can be properly controlled, so that a preferable semiconductor element can be provided. When the stacked-layer structure of the conductive layer and the metal layer is formed, diffusion of heat generated in the FET can be promoted, whereby decrease in current caused by self-heating can be prevented.

Note that the structures according to this embodiment can be combined as appropriate with any structure of the other embodiments.

Embodiment 5

In this embodiment, a method for manufacturing a semiconductor device using an SOI substrate will be described. Here, as a typified example of a semiconductor element included in a semiconductor device, an example of manufacturing an n-channel FET and a p-channel FET will be described with reference to FIGS. 10A to 10C and FIGS. 11A to 11C. Note that a method for manufacturing the semiconductor device illustrated in FIG. 2B of Embodiment 1 will be described in this embodiment. In the method for manufacturing the semiconductor device described in this embodiment, the high conductive regions 118a and 118b are not formed, which is different from the method for manufacturing the semiconductor device described in Embodiment 3. The description that overlaps with the description of the method for manufacturing the semiconductor device using an SOI substrate described in Embodiment 2 and Embodiment 3 is omitted in this embodiment, and the description of Embodiment 2 and Embodiment 3 is employed.

Figure 10A:
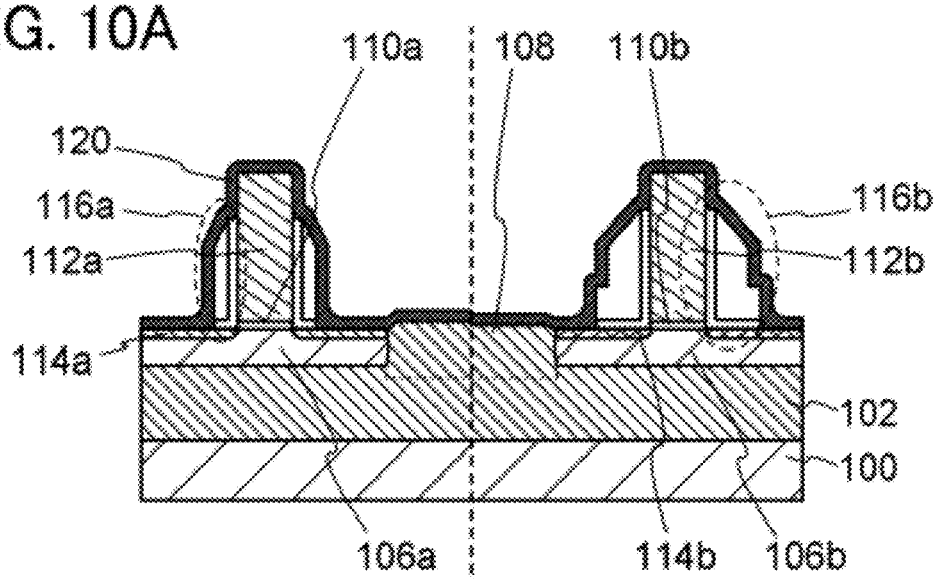
FIGS. 10A to 10C are drawings for illustrating a semiconductor device according to an embodiment of the present invention.
Figure 10B:
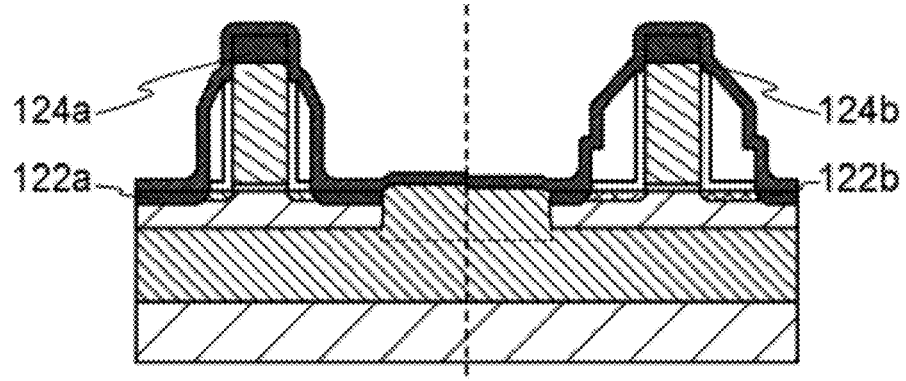

First, the metal layer 120 is formed in a manner similar to that of FIGS. 3A to 3D of Embodiment 2, so that a state illustrated in FIG. 10A is obtained (see FIG. 10A). In FIG. 10A, the high conductive regions 118a and 118b are not formed unlike in FIG. 6A. Therefore, the step for forming the high conductive regions 118a and 118b can be omitted. Next, the metal compound regions 122a and 122b and the metal compound regions 124a and 124b are formed in a manner similar to that of FIG. 4B, so that a state illustrated in FIG. 10B is obtained (see FIG. 10B).

Figure 10C:
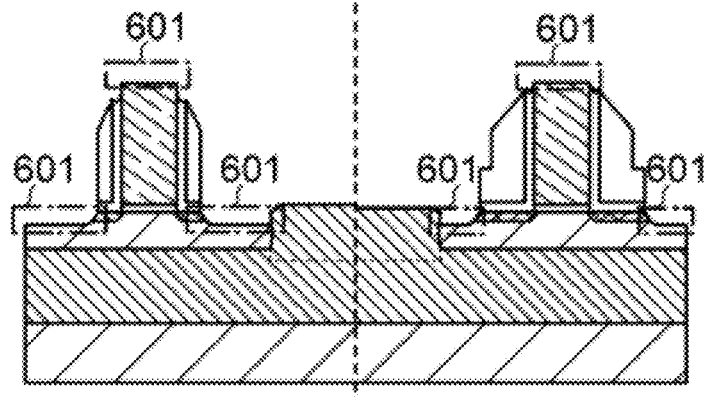

Then, the metal layer 120, the metal compound regions 122a and 122b, and the metal compound regions 124a and 124b are etched so that regions surrounded by dotted lines 601 are exposed (see FIG. 10C). As the etching, either dry etching or wet etching may be employed. The metal compound regions 122a and 122b and the metal compound regions 124a and 124b are removed by the etching, whereby a wiring layer formed later can be in contact with the low conductive regions 114a and 114b.

Next, the metal layer 602 is formed to cover the gate electrodes 112a and 112b, the single crystal semiconductor layers 106a and 106b, the sidewall insulating layers 116a and 116b, and the like. Next, the mask 603 having a desired shape is formed using a resist material or the like (see FIG. 11A). The metal layer 602 is etched using the mask 603 to form the metal regions 604a to 604c and the metal regions 605a to 605c which each serve as part of an electrode (or a wiring) (see FIG. 11B). Note that the description of the metal layer 602 and the mask 603 is omitted here since it is the same as the description in Embodiment 3.

Figure 11A:
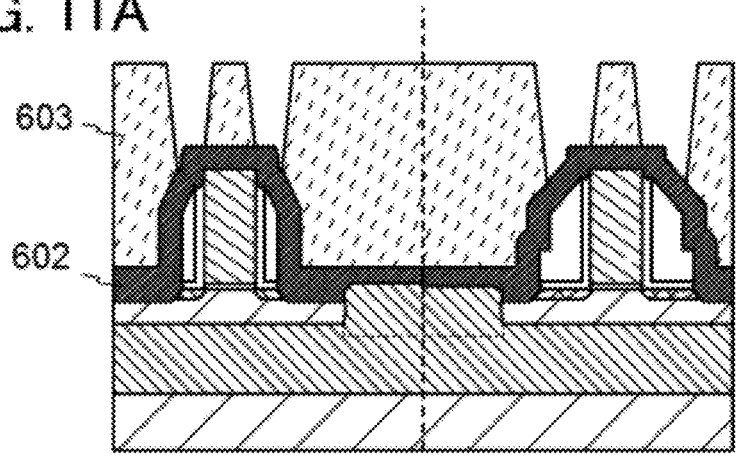
FIGS. 11A to 11C are drawings for illustrating a semiconductor device according to an embodiment of the present invention.
Figure 11B:
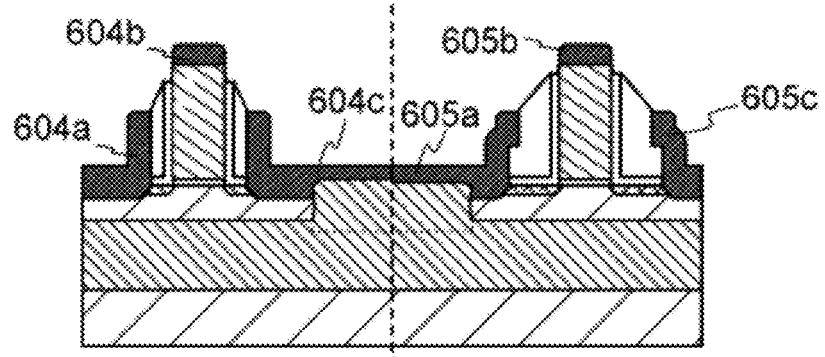

In FIG. 11A, contact interfaces between the gate insulating layers 110a and 110b and the channel formation regions formed in the single crystal semiconductor layers 106a and 106b are formed above contact interfaces between the region where the metal layer 602 is formed and the regions where the single crystal semiconductor layers 106a and 106b are formed. Accordingly, resistance of each of components for forming a transistor can be made small, so that on-current of the transistor can be improved. Further, distance between the source or the drain and the channel can be freely set because of the metal layer 602.

Figure 11C:
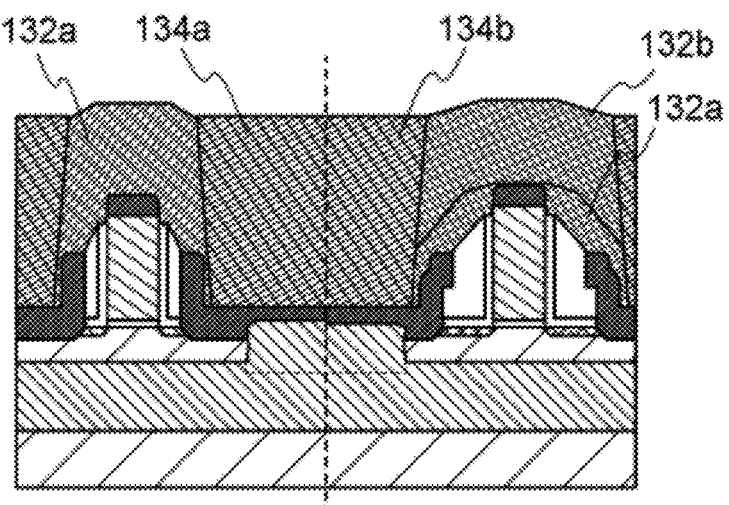

Next, the interlayer insulating layers 132a and 132b and the conductive layers 134a and 134b are formed in a manner similar to that of FIGS. 5A and 5B of Embodiment 2, so that a state illustrated in FIG. 11C is obtained (see FIG. 11C).

Through the above process, the semiconductor device including an n-channel FET and a p-channel FET can be manufactured. Note that as a structure of the wiring, a multilayer wiring structure in which an interlayer insulating layer and a conductive layer are stacked may be adopted. Adoption of the multilayer wiring structure enables to provide a highly-integrated semiconductor device. Although an SOI substrate is used as the substrate over which the FET is formed in this embodiment, an embodiment of the disclosed invention is not limited to an SOI substrate. The above FET can be formed using a single crystal semiconductor substrate such as a silicon substrate, a polycrystalline semiconductor substrate, or the like.

In an embodiment of the disclosed invention, the metal compound region is removed and a newly-formed metal layer is used as part of the electrode (or the wiring) of the FET. Therefore, the contact area of the metal layer can be increased and electric resistance can be properly controlled, so that a preferable semiconductor element can be provided. Further, the metal layer can be directly in contact with the low conductive regions 114a and 114b and electric resistance can be properly controlled, so that a preferable semiconductor element can be provided. When a new metal layer is formed, diffusion of heat generated in the FET can be promoted, whereby decrease in current caused by self-heating can be prevented.

Note that the structures according to this embodiment can be combined as appropriate with any structure of the other embodiments.

Embodiment 6

In this embodiment, examples of a semiconductor device which is an embodiment of the present invention will be described.

The semiconductor device which is an embodiment of the present invention can have a variety of structures other than the structures described in the above embodiments. Examples of the semiconductor device of this embodiment will be described with reference to FIGS. 12A and 12B and FIGS. 13A and 13B. FIGS. 12A and 12B and FIGS. 13A and 13B are cross-sectional views each illustrating an example of a semiconductor device of this embodiment. Note that when the description of components which is the same as or corresponds to (for example, reference numeral is the same) the description of the semiconductor device in any of the other embodiments, the description in the other embodiment is employed as appropriate.

Figure 12A:
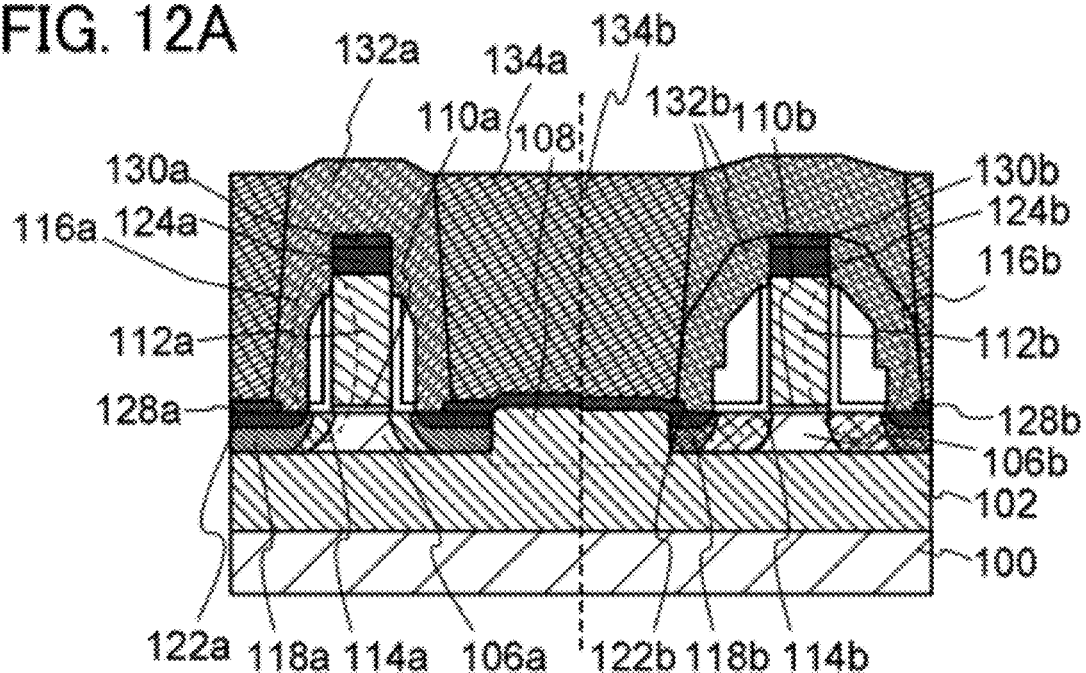
FIGS. 12A and 12B are drawings for illustrating semiconductor devices according to an embodiment of the present invention.

In a semiconductor device illustrated in FIG. 12A, the low conductive regions 114a and 114b in the semiconductor device illustrated in FIG. 1A are in contact with the insulating layer 102 and structures of the other components are the same as those of the components of the semiconductor device illustrated in FIG. 1A.

Figure 12B:
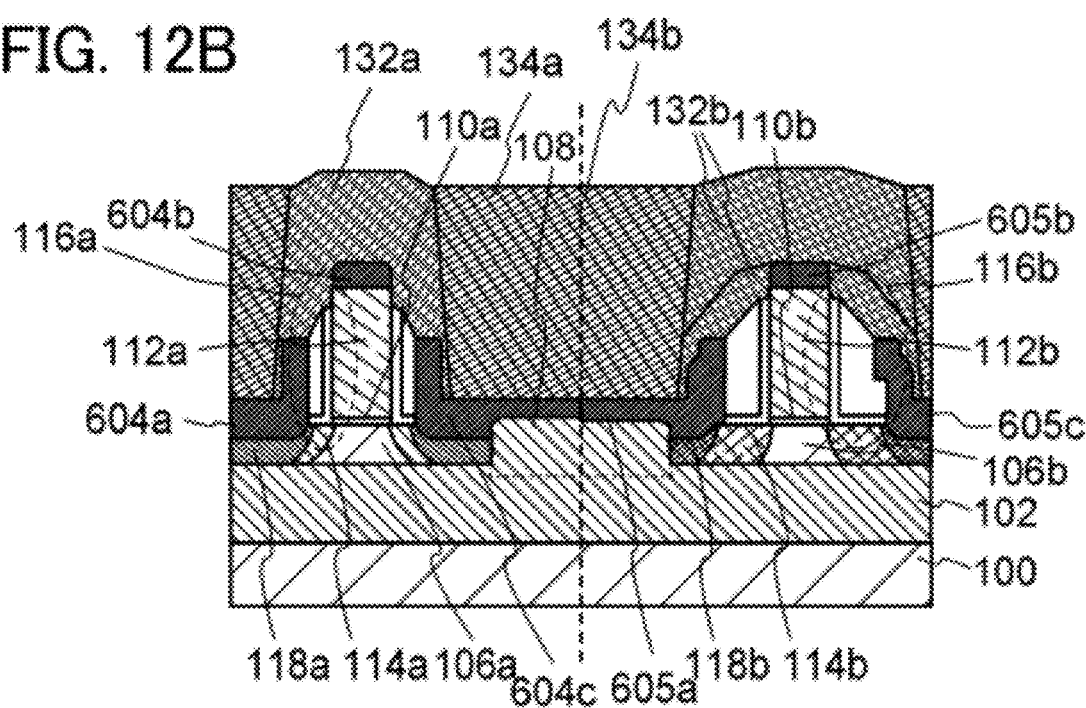

In a semiconductor device illustrated in FIG. 12B, the low conductive regions 114a and 114b in the semiconductor device illustrated in FIG. 1B are in contact with the insulating layer 102 and structures of the other components are the same as those of the components of the semiconductor device illustrated in FIG. 1B.

Figure 13A:
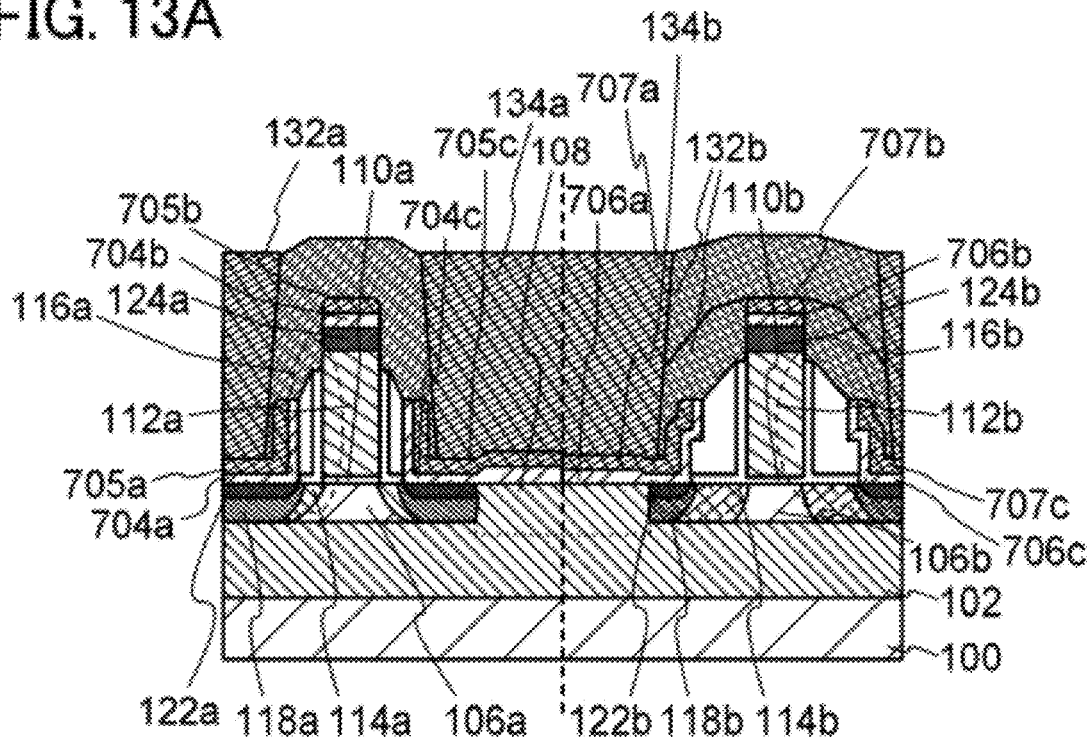
FIGS. 13A and 13B are drawings for illustrating semiconductor devices according to an embodiment of the present invention.

In a semiconductor device illustrated in FIG. 13A, the low conductive regions 114a and 114b in the semiconductor device illustrated in FIG. 2A are in contact with the insulating layer 102 and structures of the other components are the same as those of the components of the semiconductor device illustrated in FIG. 2A.

Figure 13B:
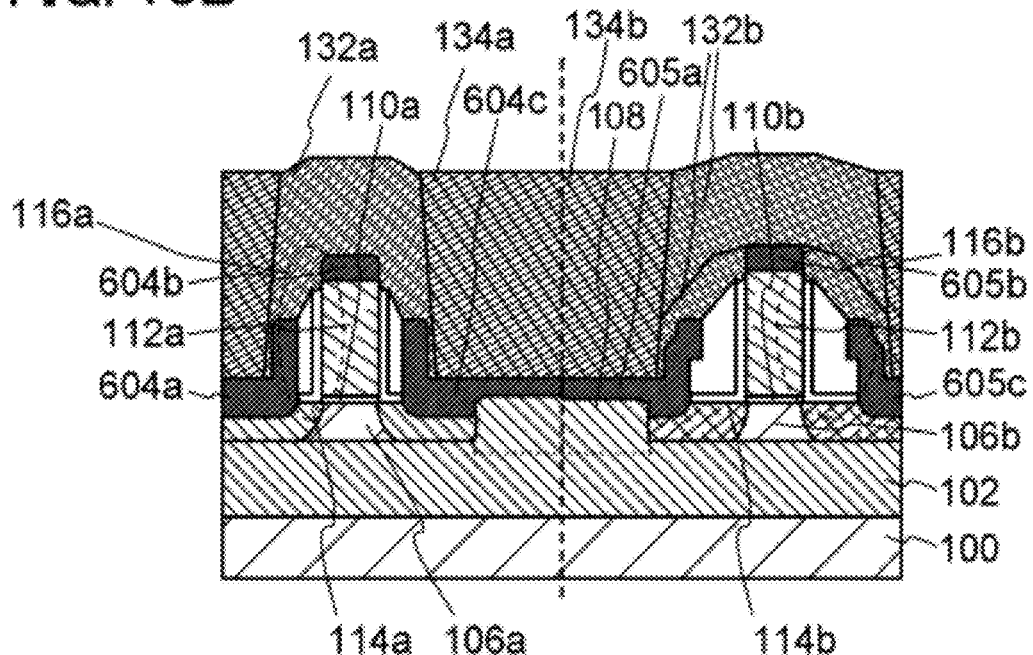

In a semiconductor device illustrated in FIG. 13B, the low conductive regions 114a and 114b in the semiconductor device illustrated in FIG. 2B are in contact with the insulating layer 102 and structures of the other components are the same as those of the components of the semiconductor device illustrated in FIG. 2B.

The low conductive regions 114a and 114b which are in contact with the insulating layer 102 in the semiconductor devices illustrated in FIGS. 12A and 12B and FIGS. 13A and 13B can be formed by adding an impurity element imparting conductivity while diffusion of the impurity element in a depth direction in the semiconductor layer is controlled. Note that heat treatment may be performed when the low conductive regions 114a and 114b which are in contact with the insulating layer 102 are formed. The heat treatment promotes diffusion of the impurity element imparting conductivity.

As illustrated in FIGS. 12A and 12B and FIGS. 13A and 13B as examples, a structure in which the low conductive regions 114a and 114b are in contact with the insulating layer 102 can be formed in the semiconductor device of this embodiment.

Other examples of the structure of the semiconductor device of this embodiment will be described with reference to FIGS. 14A and 14B and FIGS. 15A and 15B. FIGS. 14A and 14B and FIGS. 15A and 15B are cross-sectional views each illustrating an example of the semiconductor device of this embodiment. Note that when the description of components which is the same as or corresponds to (for example, reference numeral is the same) the description of the components of the semiconductor device in any of the other embodiments, the description in the other embodiment is employed as appropriate.

Figure 14A:
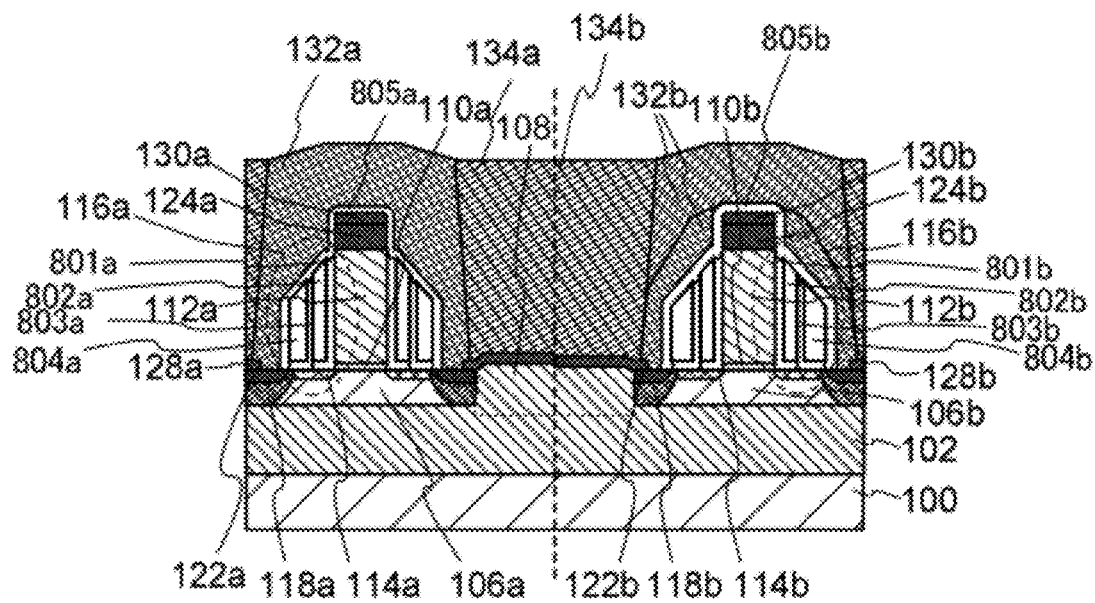
FIGS. 14A and 14B are drawings for illustrating semiconductor devices according to an embodiment of the present invention.

In a semiconductor device illustrated in FIG. 14A, the sidewall insulating layers illustrated in FIG. 1A (for example, the sidewall insulating layers 116a and 116b illustrated in FIG. 3D) are formed using three or more insulating layers, and an insulating layer 805a covering the n-channel FET and an insulating layer 805b covering the p-channel FET are included. Structures of the other components correspond to those of the components of the semiconductor device illustrated in FIG. 1A.

Figure 14B:
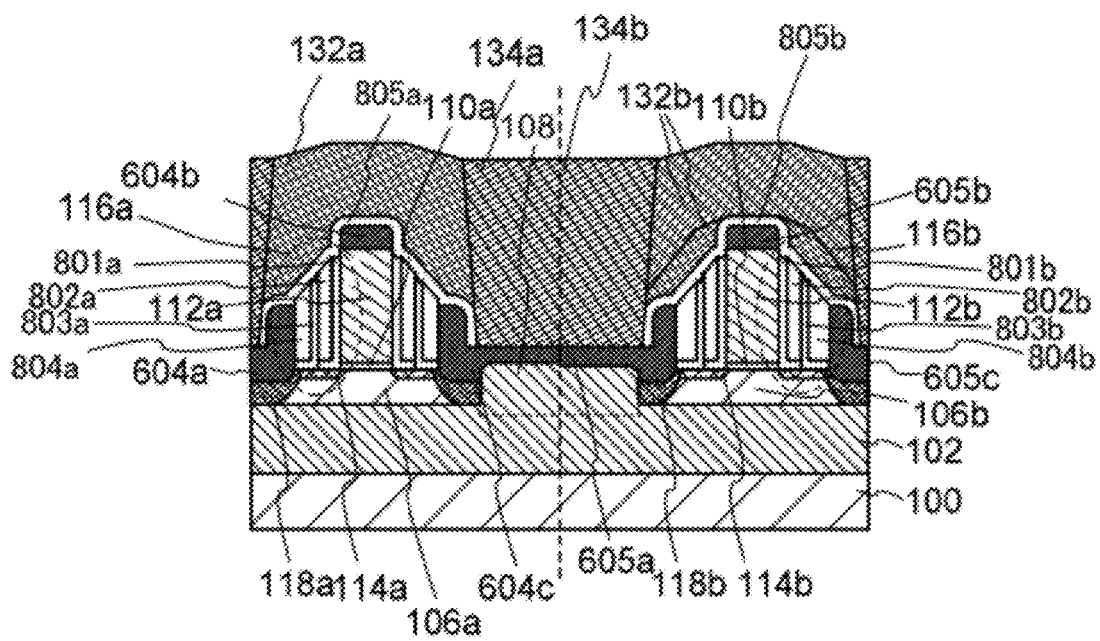

In a semiconductor device illustrated in FIG. 14B, the sidewall insulating layers illustrated in FIG. 1B are formed using three or more insulating layers, and the insulating layer 805a covering the n-channel FET and the insulating layer 805b covering the p-channel FET are included. Structures of the other components are corresponds to those of the components of the semiconductor device illustrated in FIG. 1B.

Figure 15A:
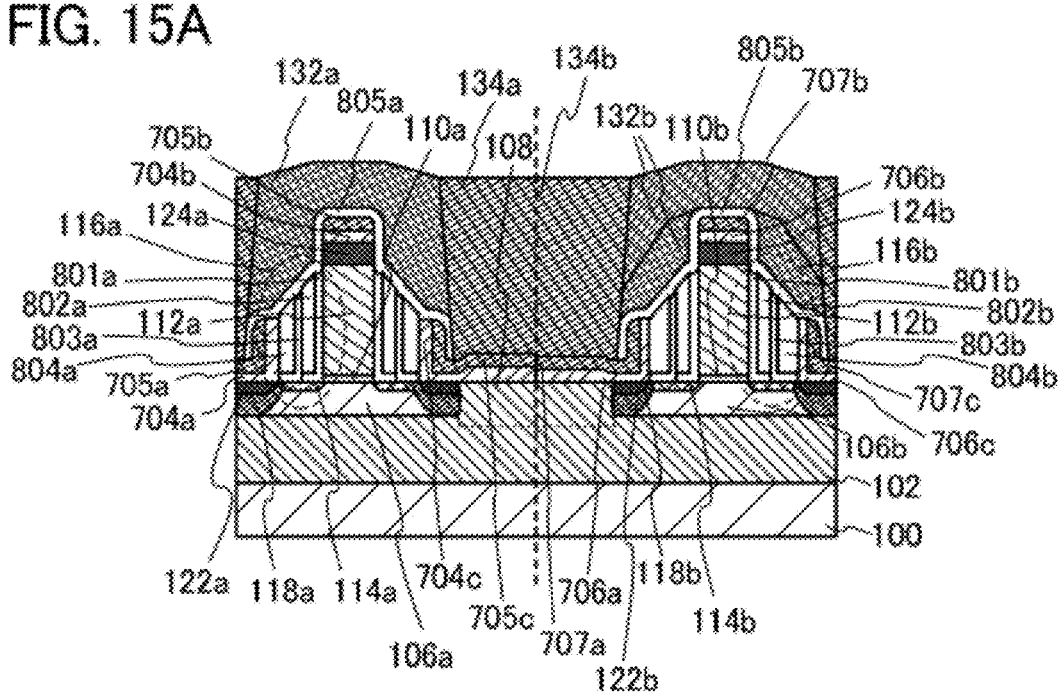
FIGS. 15A and 15B are drawings for illustrating semiconductor devices according to an embodiment of the present invention.

In a semiconductor device illustrated in FIG. 15A, the sidewall insulating layers illustrated in FIG. 2A are formed using three or more insulating layers, and the insulating layer 805a covering the n-channel FET and the insulating layer 805b covering the p-channel FET are included. Structures of the other components are corresponds to those of the components of the semiconductor device illustrated in FIG. 2A.

Figure 15B:
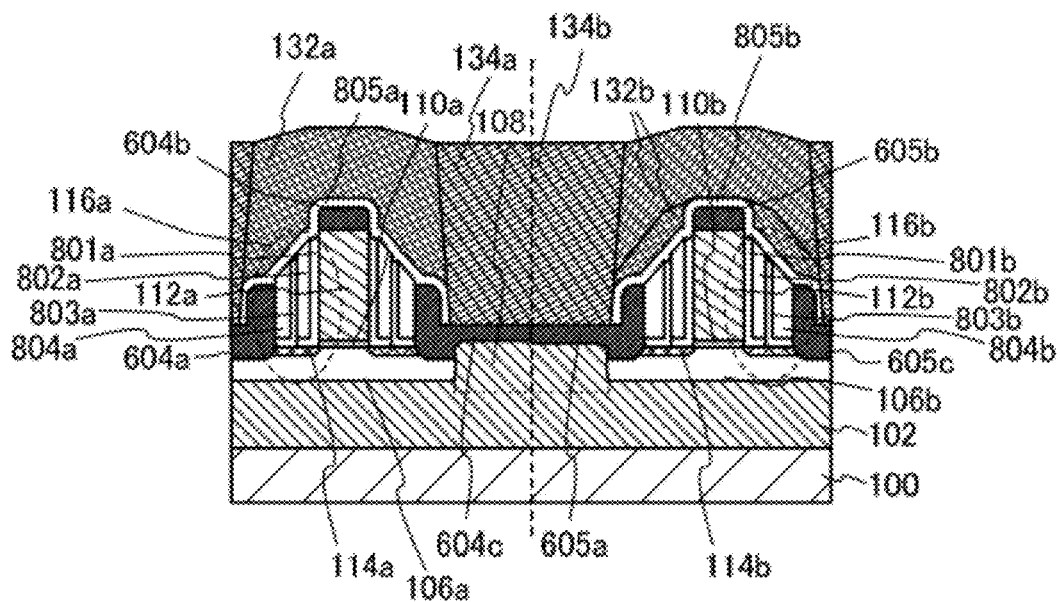

In a semiconductor device illustrated in FIG. 15B, the sidewall insulating layers illustrated in FIG. 2B are formed using three or more insulating layers, and the insulating layer 805a covering the n-channel FET and the insulating layer 805b covering the p-channel FET are included. Structures of the other components are corresponds to those of components of the semiconductor device illustrated in FIG. 2B.

The sidewall insulating layer 116a illustrated in FIGS. 14A and 14B and FIGS. 15A and 15B includes an insulating layer 801a which is in contact with the gate electrode 112a, an insulating layer 802a which is in contact with the insulating layer 801a, an insulating layer 803a which is in contact with the insulating layer 802a, and an insulating layer 804a which is in contact with the insulating layer 803a.

The sidewall insulating layer 116b illustrated in FIGS. 14A and 14B and FIGS. 15A and 15B includes an insulating layer 801b which is in contact with the gate electrode 112b, an insulating layer 802b which is in contact with the insulating layer 801b, an insulating layer 803b which is in contact with the insulating layer 802b, and an insulating layer 804b which is in contact with the insulating layer 803b.

Each of the insulating layers 801a, 802a, 803a, and 804a and the insulating layers 801b, 802b, 803b, and 804b can be formed using an insulating film such as a silicon oxide film, a silicon nitride film, or a silicon oxynitride film. A step of forming the insulating film and a step of selectively etching the formed insulating film are repeated successively, so that the insulating layers 801a, 802a, 803a, and 804a and the insulating layers 801b, 802b, 803b, and 804b can be formed. For example, the following is possible: the insulating layers 801a and 801b are formed using a silicon oxide film; the insulating layers 802a and 802b are formed using a silicon nitride film; the insulating layers 803a and 803b are formed using a silicon oxide film; and the insulating layers 804a and 804b are formed using a silicon nitride film. These insulating films can be formed by a CVD method, a sputtering method, or the like.

Note that in the low conductive region 114a of the semiconductor devices illustrated in FIGS. 14A and 14B and FIGS. 15A and 15B, the concentration of an impurity element of a region under the insulating layers 801a and 802a may differ from the concentration of an impurity element of a region under the insulating layers 803a and 804a. For example, the concentration of an impurity element of a region under the insulating layers 801a and 802a can be lower than the concentration of an impurity element of a region under the insulating layers 803a and 804a. Similarly, in the low conductive region 114b, the concentration of an impurity element of a region under the insulating layers 801b and 802b may differ from the concentration of an impurity element of a region under the insulating layers 803b and 804b. For example, the concentration of an impurity element of a region under the insulating layers 801b and 802b can be lower than the concentration of an impurity element of a region under the insulating layers 803b and 804b.

The sidewall insulating layer 116b in the region to be a p-channel FET can be larger in width than the sidewall insulating layer 116a in the region to be an n-channel FET. The thickness of the sidewall insulating layer 116a can be set as appropriate depending on the thicknesses of the insulating layers 801a, 802a, 803a, and 804a and the thickness of the sidewall insulating layer 116b can be set as appropriate depending on the thicknesses of the insulating layers 801b, 802b, 803b, and 804b.

Although each of the sidewall insulating layers 116a and 116b is formed to have four insulating layers in the semiconductor devices illustrated in FIGS. 14A and 14B and FIGS. 15A and 15B, the structure of the sidewall insulating layers 116a and 116b is not limited to this structure and may be formed using five or more insulating layers.

The insulating layers 805a and 805b illustrated in FIGS. 14A and 14B and FIGS. 15A and 15B can be formed using, for example, a silicon oxide film, a silicon nitride film, or a silicon oxynitride film. For example, a silicon oxide film can be used for the formation of the insulating layers 805a and 805b. Note that the insulating layers 805a and 805b are not necessarily provided.

In the semiconductor devices illustrated in FIGS. 14A and 14B and FIGS. 15A and 15B, each of the single crystal semiconductor layer of the n-channel FET and the single crystal semiconductor layer of the p-channel FET can have a distortion. For example, a tensile distortion can be caused to the single crystal semiconductor layer of the n-channel FET and a compressive distortion can be caused to the single crystal semiconductor layer of the p-channel FET.

The semiconductor device that is an embodiment of the present invention can include the sidewall insulating layer that is formed using three or more insulating layers, as illustrated in FIGS. 14A and 14B and FIGS. 15A and 15B. Thus, the concentration distribution of the conductive region formed under the sidewall insulating layer can be controlled. Further, the channel lengths of the p-channel FET and the n-channel FET can be set separately by setting each of the thicknesses of the insulating layers for forming the sidewall insulating layer as appropriate.

Note that this embodiment can be combined with or replaced by any of the other embodiments as appropriate.

Embodiment 7

In this embodiment, a semiconductor device with an arithmetic function will be described as an example of a semiconductor device that is an embodiment of the present invention.

Figure 16:
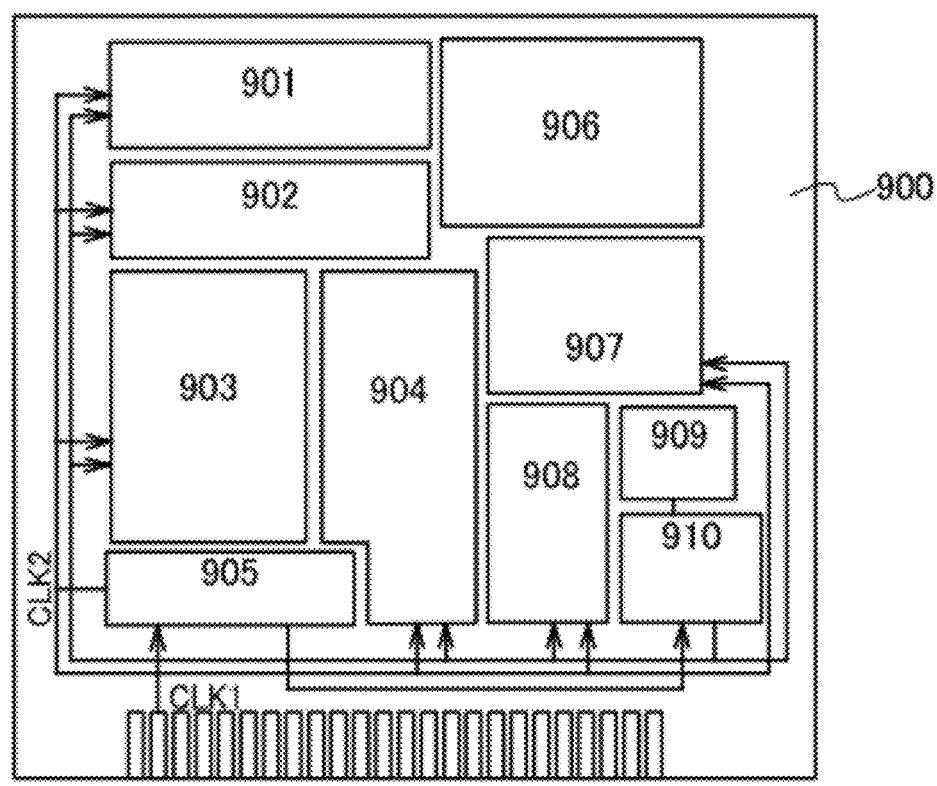
FIG. 16 is a drawing for illustrating a semiconductor device according to an embodiment of the present invention.

First, a structure of a microprocessor will be described as an example of a semiconductor device with an arithmetic function of this embodiment, with reference to FIG. 16. FIG. 16 is a block diagram illustrating an example of a structure of a microprocessor of this embodiment.

The microprocessor 900 includes an arithmetic logic unit (also referred to as ALU) 901, an ALU controller 902, an instruction decoder 903, an interrupt controller 904, a timing controller 905, a register 906, a register controller 907, a bus interface (Bus I/F) 908, a read only memory (also referred to as ROM) 909, and a memory interface (also referred to as ROM I/F) 910.

An instruction input to the microprocessor 900 through the bus interface 908 is input to the instruction decoder 903 and decoded therein. Then, the instruction is input to the ALU controller 902, the interrupt controller 904, the register controller 907, and the timing controller 905. The ALU controller 902, the interrupt controller 904, the register controller 907, and the timing controller 905 conduct various controls on the basis of the decoded instruction.

The ALU controller 902 generates signals to control operation of the ALU 901. The interrupt controller 904 is a circuit which processes an interrupt request from an external input/output device or a peripheral circuit while the microprocessor 900 is executing a program, and the interrupt controller 904 processes an interrupt request based on its priority or a mask state. The register controller 907 generates an address of the register 906, and reads and writes data from/to the register 906 in accordance with the state of the microprocessor 900. The timing controller 905 generates signals for controlling timing of operation of the ALU 901, the ALU controller 902, the instruction decoder 903, the interrupt controller 904, and the register controller 907. For example, the timing controller 905 is provided with an internal clock generator for generating an internal clock signal CLK2 based on a reference clock signal CLK1. As shown in FIG. 16, the internal clock signal CLK2 is input to other circuits.

Figure 17:
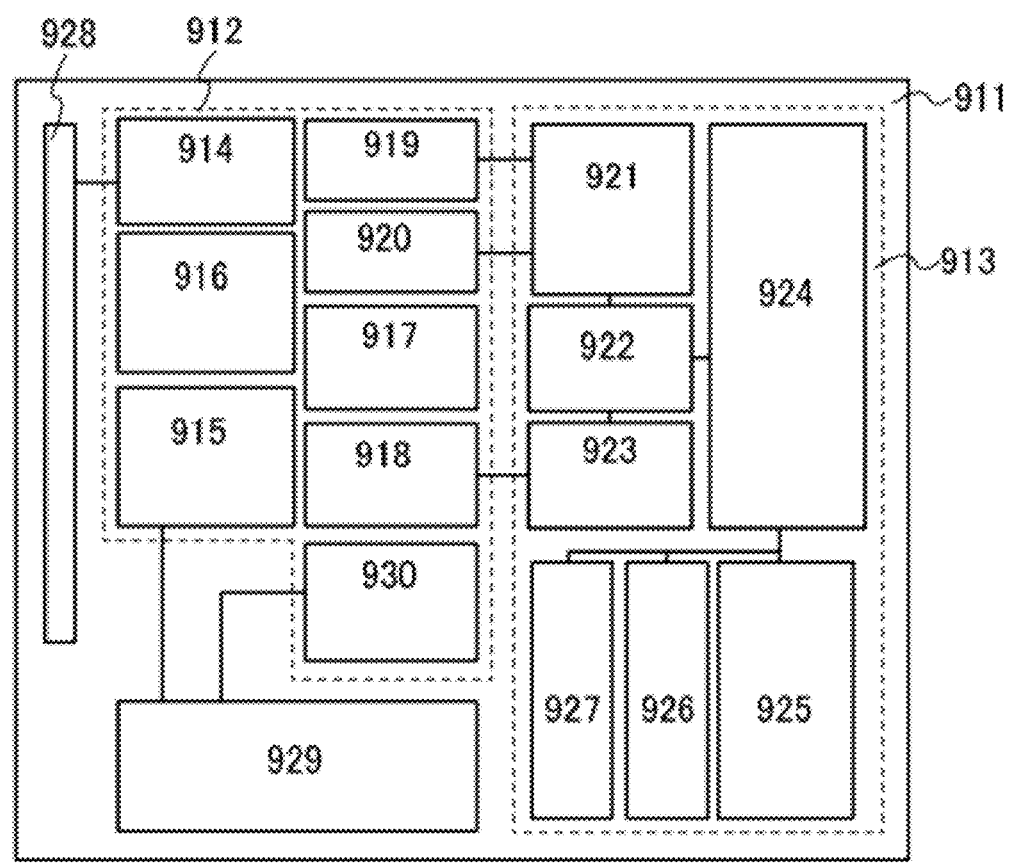
FIG. 17 is a drawing for illustrating a semiconductor device according to an embodiment of the present invention.

Next, as another example of a semiconductor device with an arithmetic function of this embodiment, a semiconductor device with a function of communicating data wirelessly and an arithmetic function will be described, with reference to FIG. 17. FIG. 17 is a block diagram illustrating another example of the semiconductor device with an arithmetic function of this embodiment. The semiconductor device shown in FIG. 17 can be called a computer which operates to transmit and receive signals to and from an external device through wireless communication (hereinafter the computer is referred to as an RFCPU).

An RFCPU 911 illustrated in FIG. 17 has an analog circuit portion 912 and a digital circuit portion 913. The analog circuit portion 912 includes a resonance circuit 914 having a resonant capacitor, a rectifier circuit 915, a constant voltage circuit 916, a reset circuit 917, an oscillation circuit 918, a demodulation circuit 919, a modulation circuit 920, and a power supply control circuit 930. The digital circuit portion 913 includes an RF interface 921, a control register 922, a clock controller 923, a CPU interface 924, a central processing unit (also referred to as CPU) 925, a random-access memory (also referred to as RAM) 926, and a read only memory 927.

The operation of the RFCPU 911 is roughly described below. Induced electromotive force is generated by the resonance circuit 914 when a signal is received by an antenna 928. The induced electromotive force is stored in a capacitor portion 929 via the rectifier circuit 915. This capacitor portion 929 is preferably formed using a capacitor such as a ceramic capacitor or an electric double layer capacitor. The capacitor portion 929 does not need to be formed over a substrate included in the RFCPU 911 and can be incorporated in the RFCPU 911 as a separate component.

The reset circuit 917 generates a signal for resetting and initializing the digital circuit portion 913 (such a signal is also referred to as a reset signal). For example, a signal that rises after the increase in the power supply voltage is generated as a reset signal. The oscillation circuit 918 changes the frequency and the duty ratio of a clock signal in accordance with a control signal generated by the constant voltage circuit 916. The demodulation circuit 919 is a circuit that demodulates received signals and the modulation circuit 920 is a circuit that modulates data for transmission.

For example, the demodulation circuit 919 is formed using a low-pass filter and binarizes a received signal of an amplitude shift keying (ASK) system on the basis of the fluctuation of the received signal. In order to vary the amplitude of a transmission signal of an amplitude shift keying (ASK) system and transmit the signal, the modulation circuit 920 changes the amplitude of a communication signal by changing a resonance point of the resonance circuit 914.

The clock controller 923 generates a control signal for changing the frequency and the duty ratio of a clock signal in accordance with the power supply voltage or a consumption current of the central processing unit 925. The power supply voltage is controlled by a power supply control circuit 930.

A signal that is input to the RFCPU 911 via the antenna 928 is demodulated by the demodulation circuit 919, and then divided into a control command, data, and the like by the RF interface 921. The control command is stored in the control register 922. The control command includes reading of data stored in the read-only memory 927, writing of data to the random access memory 926, an arithmetic instruction to the central processing unit 925, and the like.

The central processing unit 925 accesses the read-only memory 927, the random access memory 926, and the control register 922 via the CPU interface 924. The CPU interface 924 has a function of generating an access signal for any of the read-only memory 927, the random access memory 926, and the control register 922, on the basis of an address requested by the central processing unit 925.

As an arithmetic method of the central processing unit 925, a method may be employed in which the read-only memory 927 stores an operating system (OS) and a program is read and executed at the time of starting operation. Alternatively, a method may be employed in which a circuit dedicated to arithmetic is formed and an arithmetic process is conducted using hardware. In a method in which both hardware and software are used, part of arithmetic processing can be conducted by a circuit dedicated to arithmetic, and the other part of the arithmetic processing can be conducted by the central processing unit 925 with the use of a program.

As illustrated in FIGS. 16 and 17 as examples, a semiconductor device with an arithmetic function of this embodiment can have a variety of functions using an arithmetic processing and can perform the arithmetic processing at a high speed.

Note that this embodiment can be combined with or replaced with any of the other embodiments as appropriate.

Embodiment 8

In this embodiment, results of examining the effectiveness of the disclosed invention using computer simulation will be described. Here, with use of software (Smart Spice) produced by Silvaco Data Systems Inc., the relation between channel length and delay time in a 19-stage ring oscillator was calculated. The case where silicon is used as a material included in a semiconductor layer was calculated. The channel length was changed in the range of 0.04 μm to 0.25 μm.

As a calculation model, BSIM4 was used. The thickness of a gate insulating layer was set to 2 nm, and other parameters such as contact resistance, wiring resistance, and parasitic capacitance were set on the basis of default (fixed) condition.

Figure 18A:
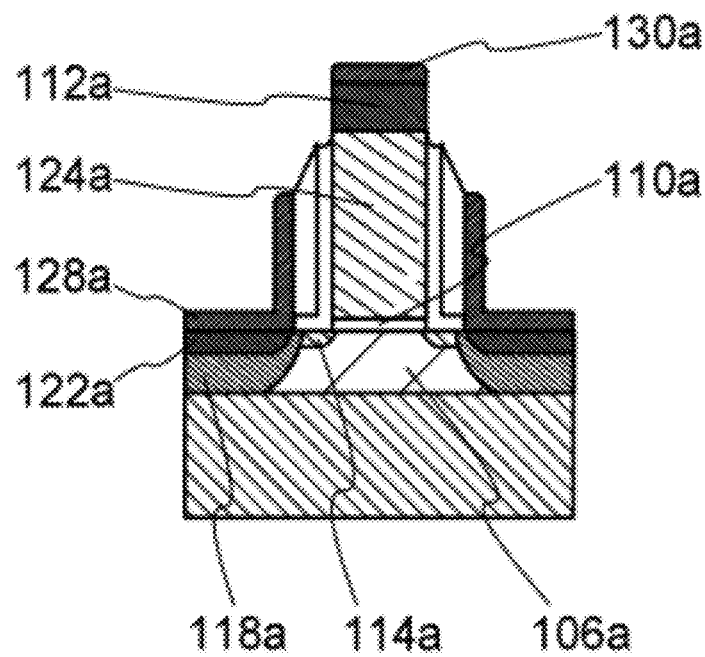
FIGS. 18A and 18B are drawings for illustrating a semiconductor device according to an embodiment of the present invention.
Figure 18B:
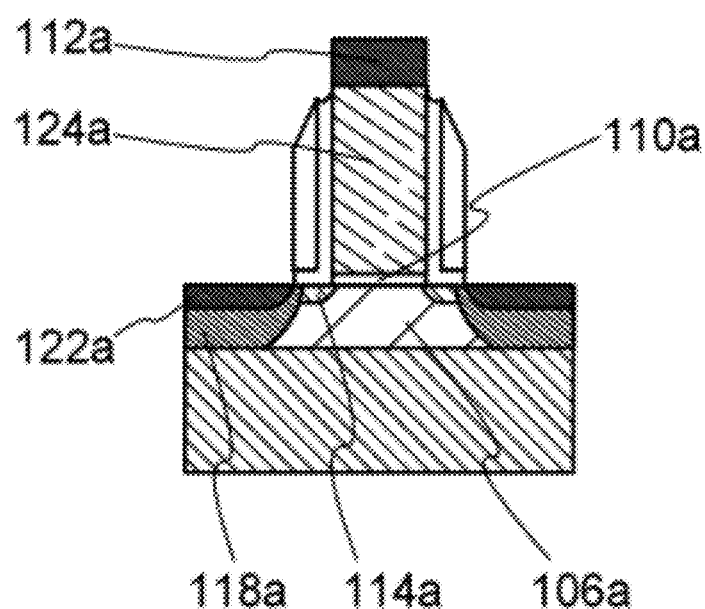

A model of an FET used for the calculation is illustrated in FIG. 18A. A model of an FET used as a comparative example is illustrated in FIG. 18B. The calculation was carried out on the assumption that the resistance value of a metal region which is a tenth of the resistance value of a metal compound region of the comparative example (as an example, R_metal=10Ω, R_silicide=100Ω) is achieved by adjusting the thickness of the metal region.

Although practical resistance values of the metal region and the metal compound region are smaller, the above resistance values were employed for the sake of simplicity. Therefore, the calculation results show relative indices.

Figure 19A:
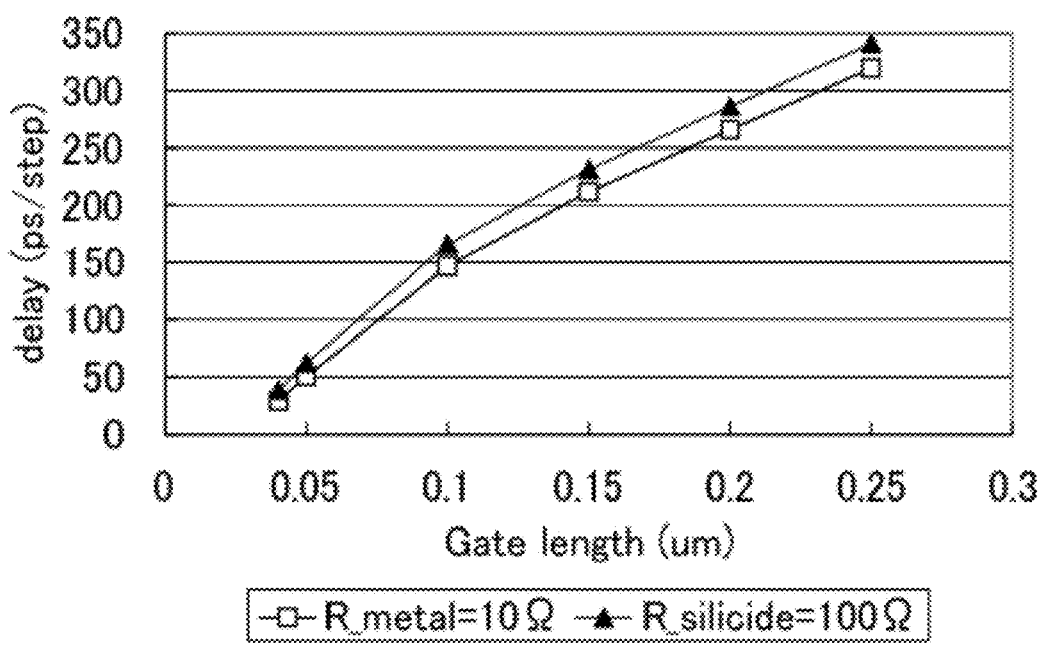
FIGS. 19A and 19B are graphs for illustrating a semiconductor device according to an embodiment of the present invention.
Figure 19B:
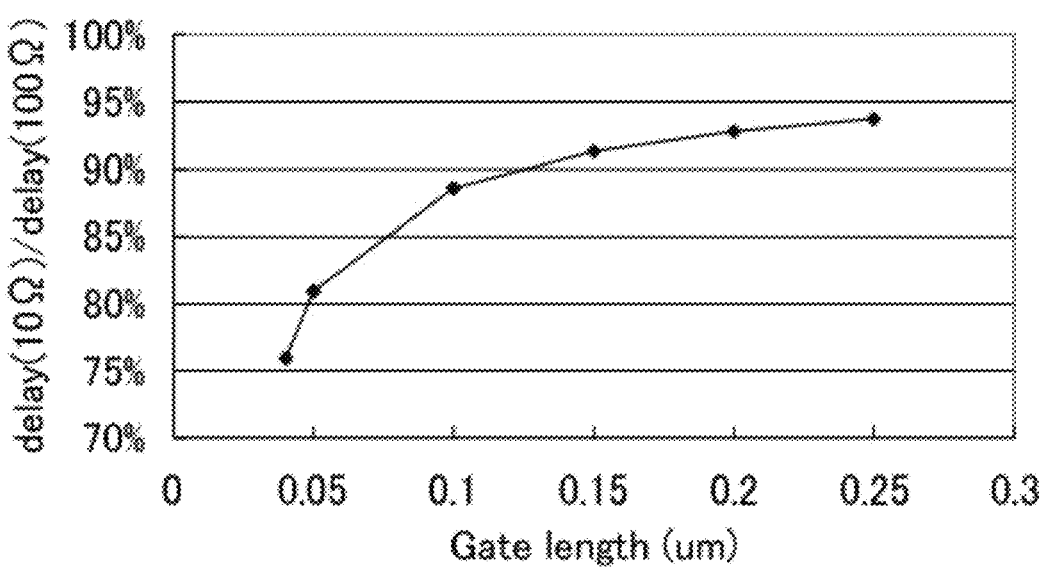

The results of the above-mentioned calculation are shown in FIGS. 19A and 19B. The calculation result of the delay time is shown in FIG. 19A. The vertical axis represents the delay time and the horizontal axis represents the channel length. As the channel length becomes shorter, the delay time becomes shorter. This is because resistance component of the channel gets smaller. The proportion of the delay time of the FET illustrated in FIG. 18B in the delay time of the FET illustrated in FIG. 18A is shown in FIG. 19B. The vertical axis represents the delay time and the horizontal axis represents the channel length. From FIG. 19B, it is found that as the gate length becomes shorter, the effect of decrease in resistance appears remarkably.

The above calculation results show that an embodiment of the disclosed invention is effective in reduction in resistance. Note that the structures according to this embodiment can be combined as appropriate with any structure of the other embodiments.

Embodiment 9

Process of Manufacturing SOI Substrate

In this embodiment, an example of a method for manufacturing an SOI substrate will be described with reference to FIGS. 20A, 20B-1, 20B-2, 20B-3, 20C, 20D, and 20E.

First, a base substrate 1000 is prepared (see FIG. 20A). When a substrate formed using a semiconductor is used, a single crystal semiconductor substrate or a polycrystalline semiconductor substrate which are formed using a Group 14 element such as silicon, germanium, silicon germanium, or silicon carbide can be employed as the base substrate 1000. Alternatively, a solar grade silicon substrate (SOG-Si; e.g., a material having a Si purity of about 99.9999%) that is used for manufacturing a solar battery, or the like can be used. Further alternatively, a substrate which is formed using an insulator, such as a ceramic substrate, a quartz substrate, or a sapphire substrate; a substrate which is formed using a conductor such as metal or stainless steel; or the like can be used as the base substrate 1000.

Other than the above-mentioned material, a light-transmitting glass substrate that is used for a liquid crystal display device or the like can be used as the base substrate 1000. A substrate having a strain point of greater than or equal to 580° C. (preferably greater than or equal to 600° C.) may be preferably used as the glass substrate. It is preferable that the glass substrate be a non-alkali glass substrate. The non-alkali glass substrate is formed using a glass material such as aluminosilicate glass, aluminoborosilicate glass, or barium borosilicate glass, for instance.

Next, a bond substrate 1010 is prepared (see FIG. 20B-1). As the bond substrate 1010, for example, a single crystal semiconductor substrate formed using a Group 14 element such as silicon, germanium, silicon germanium, or silicon carbide can be used.

Although there is no limitation on the size of the bond substrate 1010, for example, a semiconductor substrate whose size is 8 inches (200 mm) in diameter, 12 inches (300 mm) in diameter, or 18 inches (450 mm) in diameter can be used. Alternatively, a round semiconductor substrate may be processed into a rectangular shape to be used.

Next, an insulating layer 1014 is formed on the bond substrate 1010 (see FIG. 20B-2).

As the insulating layer 1014, for instance, a silicon oxide film, a silicon oxynitride film, a silicon nitride film, a silicon nitride oxide film, or the like can be used. These films can be formed by a thermal oxidation method, a CVD method, a sputtering method, or the like. When a CVD method is employed to form the insulating layer 1014, use of a silicon oxide film formed using organosilane, such as tetraethoxysilane (abbreviation: TEOS) (chemical formula: $Si(OC_2H_5)_4$) as the insulating layer 1014 is preferable in terms of productivity.

In this embodiment, by subjecting the bond substrate 1010 to thermal oxidation treatment, the insulating layer 1014 (here, a silicon oxide film) is formed. The thermal oxidation treatment is preferably performed in an oxidizing atmosphere to which halogen is added. For example, the bond substrate 1010 is subjected to the thermal oxidation treatment in an oxidizing atmosphere to which chlorine (Cl) is added, thereby forming the insulating layer 1014 oxidized with HCl. Accordingly, the insulating layer 1014 includes chlorine atoms.

Note that although the insulating layer 1014 has a single-layer structure in this embodiment, it may have a stacked-layer structure. Further, when the insulating layer 1014 is not necessarily provided, for example, when there is no particular problem with the bond, a structure in which the insulating layer 1014 is not provided may be employed. An insulating layer may be formed using a material the same or substantially the same as that of the insulating layer 1014 over the base substrate 1000.

Next, the bond substrate 1010 is irradiated with ions, thereby forming an embrittlement region 1012 (see FIG. 20B-3). More specifically, for example, an ion beam including ions accelerated by an electric field is delivered to form the embrittlement region 1012 at a certain depth from a surface of the bond substrate 1010. Accelerating energy of the ion beam or the incidence angle thereof controls the depth at which the embrittlement region 1012 is formed. In other words, the embrittlement region 1012 is formed in a region at a depth the same or substantially the same as the average penetration depth of the ions. Here, the depth at which the embrittlement region 1012 is formed is preferably uniform in the entire surface of the bond substrate 1010.

Further, the depth at which the above-described embrittlement region 1012 is formed determines the thickness of the semiconductor layer that is to be separated from the bond substrate 1010. The depth at which the embrittlement region 1012 is formed is greater than or equal to 50 nm and less than or equal to 1 μm, preferably greater than or equal to 50 nm and less than or equal to 300 nm, from the surface of the bond substrate 1010. In this embodiment, the ion irradiation is performed after the insulating layer 1014 is formed; however, the ion irradiation may be performed before the formation of the insulating layer 1014.

The embrittlement region 1012 can be formed by ion doping treatment. The ion doping treatment can be performed using an ion doping apparatus. An ion doping apparatus is typically a non-mass-separation type apparatus for irradiating an object to be processed that is disposed in a chamber with all kinds of ions which are generated by plasma excitation of a process gas. The apparatus is called "non-mass-separation type apparatus" because an object to be processed is irradiated with all kinds of ions without mass-separating ions in plasma. In contrast, an ion implantation apparatus is a mass-separation type apparatus. An ion implantation apparatus is an apparatus for separating kinds of ions in plasma by mass and for irradiating an object to be processed with ions having a specific mass.

The main structure of an ion doping apparatus includes a chamber in which an object to be processed is disposed, an ion source for generating desired ions, and an acceleration mechanism for acceleration of ions and for irradiation therewith. The ion source includes a gas supply device for supplying a source gas from which a desired kind of ion is generated; an electrode for producing plasma by exciting a source gas; and the like. As the electrode for producing plasma, a filament electrode, a capacitively-coupled high-frequency discharge electrode, or the like is used. The acceleration mechanism has electrodes such as an extraction electrode, an accelerating electrode, a decelerating electrode, and a ground electrode; a power source for supplying power to these electrodes; and the like. The electrodes included in the acceleration mechanism are provided with a plurality of openings or slits, through which ions that are generated from the ion source are accelerated. Note that the structure of an ion doping apparatus is not limited to the structure described above, and a mechanism according to need is provided.

In this embodiment, ions which are generated from a hydrogen gas are added to the bond substrate 1010 with an ion doping apparatus. As a plasma source gas, a gas including hydrogen is supplied; for example, $H_2$ is supplied. A hydrogen gas is excited to produce plasma, and ions included in the plasma are accelerated without mass separation, so that the bond substrate 1010 is irradiated with the accelerated ions.

In the ion doping apparatus, the percentage of $H_3^+$ to the total quantity of ion species ($H^+$, $H_2^+$, and $H_3^+$) generated from a hydrogen gas is set to be higher than or equal to 50%. More preferably, the proportion of $H_3^+$ is set to be higher than or equal to 80%. Since mass separation is not performed in an ion doping apparatus, the percentage of one kind ($H_3^+$) of plural kinds of hydrogen ions generated in plasma is preferably set to be higher than or equal to 50%, more preferably higher than or equal to 80%. By irradiation with ions having the same mass, ions can be added in a concentrated manner to the same depth in the bond substrate 1010.

In order to form the embrittlement region 1012 in a shallow region in the bond substrate 1010, the acceleration voltage of the ion beam needs to be low. However, by increasing the percentage of $H_3^+$ ions in the plasma, the hydrogen ions can be added to the bond substrate 1010 efficiently. Because mass of $H_3^+$ ions is three times as large as that of the $H^+$ ions; therefore, when one hydrogen atom is added to a region at the same depth, the acceleration voltage of $H_3^+$ ions can be three times as large as that of $H^+$ ions. Therefore, takt time of an ion irradiation process can be shortened, so that productivity and throughput can be improved.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained. Further, when an ion doping apparatus is used, heavy metals may also be introduced at the time of the ion irradiation; however, by irradiation with ions through the insulating layer 1014 including chlorine atoms, the bond substrate 1010 can be prevented from being contaminated due to the heavy metals.

Note that the step of irradiating the bond substrate 1010 with the accelerated ion beam can also be performed with an ion implantation apparatus. When an ion implantation apparatus is used, it is preferable to perform mass separation to emit $H_3^+$ ions.

Next, the base substrate 1000 and the bond substrate 1010 are bonded (see FIG. 20C). Specifically, the base substrate 1000 and the bond substrate 1010 are bonded to each other with the insulating layer 1014 provided therebetween. After the surface of the base substrate 1000 is in contact with the surface of the insulating layer 1014, a pressure treatment is performed, which realizes the bond between the base substrate 1000 and the bond substrate 1010. Note that as the mechanism of the bond, a mechanism related to van der Waals' force, a mechanism related to hydrogen bonding, or the like is considered.

Note that before the bond between the bond substrate 1010 and the base substrate 1000, at least one of the base substrate 1000 and the insulating layer 1014 formed on the bond substrate 1010 is preferably subjected to plasma treatment. The plasma treatment for at least one of the insulating layer 1014 and the base substrate 1000 contributes to an increase in hydrophilic groups or an improvement of planarity. Accordingly, the bond strength between the bond substrate 1010 and the base substrate 1000 can be enhanced.

Here, the plasma treatment is performed in a plasma state which is produced by introducing an inert gas (such as an Ar gas) into a chamber in a vacuum state and applying a bias voltage to a surface to be processed (e.g., the base substrate 1000). Since electrons and Ar cations are present in the plasma, the Ar cations are accelerated to a cathode side (a base substrate 1000 side). By collision of the accelerated Ar cations with the surface of the base substrate 1000, the surface of the base substrate 1000 is etched by sputtering. At this time, a projection of the surface of the base substrate 1000 is preferentially etched using sputtering; thus, the planarity of the surface of the base substrate 1000 can be improved. Further, by the accelerated Ar cations, impurities such as organic substances on the base substrate 1000 can be removed and the base substrate can be activated. Furthermore, plasma treatment may be performed in a plasma state by introducing a reactive gas (for example, an $O_2$ gas or an $N_2$ gas) as well as an inert gas into a chamber in a vacuum state and applying a bias voltage to a surface to be processed. When the reactive gas is introduced, it is possible to repair defects caused by etching of the surface of the base substrate 1000 using sputtering.

After the plasma treatment, it is preferable that the base substrate 1000 and the insulating layer 1014 formed on the bond substrate 1010 be subjected to surface treatment. As the surface treatment, ozone treatment (for example, ozone water cleaning or UV ozone treatment), megasonic cleaning, two fluid cleaning (a method for spraying functional water such as pure water or hydrogen-containing water with a carrier gas such as nitrogen), or a combination thereof can be performed. The ozone water cleaning and cleaning with hydrofluoric acid may be repeated plural times. In particular, after plasma treatment is performed on the surface of the insulating layer 1014 and the surface of the base substrate 1000 as described above, surface treatment is performed, whereby dust such as organic substances on the surface of the insulating layer 1014 and the surface of the base substrate 1000 can be removed and the surfaces can be made hydrophilic. As a result, bond strength between the insulating layer 1014 and the base substrate 1000 can be enhanced.

After the bond substrate 1010 and the base substrate 1000 are bonded to each other, the bond substrate 1010 and base substrate 1000 that are bonded may preferably be subjected to heat treatment so that the bond is strengthened. The heat temperature at this time needs to be a temperature at which the separation at the embrittlement region 1012 does not proceed. For example, the temperature is set to be less than 400° C., preferably less than or equal to 300° C. There is no particular limitation on the length of the time for the heat treatment, which may be optimally set as appropriate depending on the relation between the treatment time and the bond strength. For instance, the heat treatment can be performed at 200° C. for 2 hours. Further, only the region that is used for the bond can be locally heated by irradiation with microwaves or the like. When there is no problem with the bond strength, the above heat treatment may be omitted.

Next, the bond substrate 1010 is separated into the semiconductor layer 1016 and the bond substrate 1020 in the embrittlement region 1012 (see FIG. 20D). The separation of the bond substrate 1010 may preferably be performed by heat treatment. The temperature for the heat treatment can be set on the basis of the upper temperature limit of the base substrate 1000. For instance, when a glass substrate is used as the base substrate 1000, the temperature for the heat treatment is preferably set to be greater than or equal to 400° C. and less than or equal to 750° C. However, as long as the glass substrate can withstand the temperature greater than this range, the temperature is not limited thereto. Note that in this embodiment, the heat treatment is performed at 600° C. for 2 hours.

The above heat treatment causes a change in the volume of microvoids formed in the embrittlement region 1012, resulting in generation of a crack in the embrittlement region 1012. As a result, the bond substrate 1010 is separated along the embrittlement region 1012. Accordingly, the semiconductor layer 1016 separated from the bond substrate 1010 is left over the base substrate 1000. Further, since the interface for bonding the substrate 1010 and the insulating layer 1014 is heated by this heat treatment, a covalent bond is formed at the interface, so that the bond strength can be further enhanced.

There are defects caused by the separation step or the ion irradiation step on a surface of the semiconductor layer 1016 formed as described above, and the planarity of the surface is impaired. Therefore, treatment for reducing the defects on the semiconductor layer 1016 or a treatment for improving the surface planarity of the semiconductor layer 1016 may preferably be performed.

In this embodiment, for example, irradiating the semiconductor layer 1016 with laser light can realize the reduction in defects and the improvement of the planarity of the semiconductor layer 1016. Irradiating the semiconductor layer 1016 with laser light makes the semiconductor layer 1016 melt so that the semiconductor layer 1016 cools and solidifies, resulting in formation of a single crystal semiconductor layer in which the defects are reduced and the surface planarity is improved.

Further, a thinning step for decreasing the thickness of the single crystal semiconductor layer may be carried out. To thin the semiconductor layer, either dry etching treatment, or wet etching treatment, or a combination of both may be performed. For example, when the semiconductor layer is formed using silicon, the semiconductor layer can be thinned using $SF_6$ and $O_2$ as process gases by dry etching treatment.

As described above, the semiconductor layer 1018 can be formed over the base substrate 1000 (see FIG. 20E).

Note that although the case where the laser light irradiation precedes the etching treatment in this embodiment, an embodiment of the present invention is not limited thereto: the etching treatment may be performed before the laser light irradiation, or both before and after the laser light irradiation.

Note that although laser light is used to realize the reduction in defects and the improvement of the planarity in this embodiment, an embodiment of the present invention is not limited thereto. The reduction in defects and improvement of the planarity may be realized by using any other method such as heat treatment. Further, when treatment for a defect reduction is unnecessary, treatment for improving planarity, such as etching treatment, may be employed alone.

Note that the bond substrate 1020 after the separation becomes a reprocessed bond substrate through a reprocessing process, and can be reused. Since there are defects due to the embrittlement region 1012 or the like on a surface of the bond substrate 1020 after the separation, such defects may preferably be removed before the reprocessing process. Accordingly, the reprocessing process can be carried out more successfully. As methods of the removal, there are etching treatment and polishing treatment such as CMP.

<Solar Grade Silicon>

Next, the case of using solar grade silicon as an embodiment of the base substrate 1000 used in this embodiment is described in detail.

As described in the process of manufacturing an SOI substrate, the base substrate 1000 is bonded to the bond substrate 1010 which is to be the semiconductor layer 1016, with the insulating layer 1014 which is formed using the same material as the material of the bond substrate 1010 provided therebetween through a chemical bond. Therefore, the base substrate 1000 is preferably formed using a silicon substrate. Further, there are other advantages in using a silicon substrate as the base substrate 1000. For example, a process of manufacturing a device using a conventional bulk wafer can be used as it is, and the silicon substrate and the semiconductor layer 1016 are mutually compatible with each other with respect to mechanical properties.

Also in this embodiment, the base substrate 1000 can be formed using a silicon substrate. However, in this embodiment, it is preferable to use single crystal silicon with solar grade quality, not single crystal silicon with semiconductor-grade quality which is conventionally used.

A conventional semiconductor-grade single crystal silicon with 11N (eleven nines) purity or more is used for a fine device whose device characteristics are affected by a very small amount of impurity. As a typical method for making a high-purity silicon material, a Siemens process is known. In the Siemens process, trichlorosilane ($SiHCl_3$) as an intermediate compound is reduced by hydrogen. The Siemens process is briefly described.

Silica stone is mixed with coke or the like, and the mixture is subjected to reduction firing, so that metal-grade silicon with 98% to 99% purity is manufactured.

$SiO_2+C \rightarrow Si+CO_2$ $SiO_2+2C \rightarrow Si+CO$

Next, the metal-grade silicon is reacted with hydrogen chloride at a high temperature, so that trichlorosilane ($SiHCl_3$) is obtained.

$Si+3HCl \rightarrow SiHCl_3+H_2$

The obtained trichlorosilane ($SiHCl_3$) in a liquid state is rectified and vaporized. The resulting object and hydrogen are introduced together into a reaction furnace, whereby reaction occurs on a surface of a silicon rod heated at approximately 1100° C. to 1200° C., and polycrystalline silicon with 11N (eleven nines) purity is deposited onto the surface of the silicon rod.

$SiHCl_3+H_2 \rightarrow Si+3HCl$

The above is a method for making a high-purity silicon material for forming semiconductor-grade single crystal silicon, which is conventionally used. After that, a high-purity polycrystalline silicon material is melted in a quartz crucible, and an impurity imparting desired conductivity is mixed. An ingot of single crystal silicon is grown with a seed crystal in contact with silicon melt rotated. Such a method is usually referred to as a Czochralski method (a CZ method). After that, the ingot is cut in a plate-like shape and is mirror-polished. The resulting object is a semiconductor-grade single crystal silicon substrate.

On the other hand, solar grade single crystal silicon has approximately 6N to 7N purity. Although such solar grade single crystal silicon is not suitable for use in a semiconductor device such as VLSI, such solar grade single crystal silicon functions well for use in a solar cell. Although a variety of methods are tried to form a solar grade single crystal silicon material, a material that is formed by a zinc reduction method is preferable. A method for forming a solar grade silicon material by the zinc reduction method is briefly described below.

In a manner similar to the Siemens process, silica stone is mixed with coke or the like, and the mixture is subjected to reduction firing, so that metal-grade silicon with 98% to 99% purity is manufactured.

$SiO_2+C \rightarrow Si+CO_2$ $SiO_2+2C \rightarrow Si+CO$

Next, the metal-grade silicon is reacted with chlorine at a high temperature, so that silicon tetrachloride ($SiCl_4$) is obtained.

$Si+2Cl_2 \rightarrow SiCl_4$

The obtained silicon tetrachloride ($SiCl_4$) in a liquid state is rectified and vaporized. The resulting object and a vaporized zinc gas (a boiling point: 907° C.) are introduced together into a reaction furnace. In the reaction furnace, polycrystalline silicon with 6N to 7N purity is precipitated through a reduction reaction.

$SiCl_4+2Zn \rightarrow Si+2ZnCl_2$

Note that here, zinc chloride ($ZnCl_2$) as a by-product can be collected in a solid state in a collection tub.

The above is a method for forming a solar grade silicon material with 6N to 7N purity by a zinc reduction method. The subsequent steps of pulling up a single crystal ingot and forming the single crystal ingot into a substrate through cutting, polishing, or the like are similar to those of the semiconductor-grade single crystal silicon described above.

It is known that the Siemens process as a method for forming the semiconductor-grade silicon material and the zinc reduction method as a method for forming a solar grade silicon material which are described above are greatly different from each other in cost as well as in the above-mentioned different points.

The reasons are that a reaction speed of a zinc gas with silicon tetrachloride in the zinc reduction method is higher than a reaction speed of hydrogen with trichlorosilane ($SiHCl_3$) in the Siemens process, and that the zinc reduction method provides a higher yield than the Siemens process. Further, a reaction temperature thereof in the zinc reduction method is lower than that in the Siemens process, whereby cost for running an apparatus can be suppressed. Furthermore, in the zinc reduction method, an unreacted intermediate compound and a by-product can be easily collected and reused.

In the Siemens process, unreacted hydrogen and hydrogen chloride as a by-product are evacuated together with unreacted trichlorosilane ($SiHCl_3$). Trichlorosilane ($SiHCl_3$) is in a liquid state at room temperatures. In order to reuse all collected objects, vapor-liquid separation and separation of a gas component, and equipment for the separations are needed. On the other hand, in the zinc reduction method, only hydrogen chloride as a by-product is evacuated together with unreacted silicon tetrachloride. In terms of the reaction temperature, although zinc chloride ($ZnCl_2$) is in a gas state, the zinc chloride ($ZnCl_2$) cooled to a temperature lower than or equal to a solidification temperature (melting point: 275° C.) in a collection tub is solidified and collected. Silicon tetrachloride is also in a liquid state at room temperatures, and the collected object can be easily subjected to solid-liquid separation. The collected zinc chloride ($ZnCl_2$) can be decomposed by an electric current in a melting state, and metal zinc which is precipitated at a cathode and chlorine which is generated at an anode can be collected separately and be reused.

Therefore, the energy needed for formation in the zinc reduction method is a fourth to a fifth of that needed for formation in the Siemens process. The manufacturing cost in the zinc reduction method might be a third to a fifth of that in the Siemens process.

The base substrate 1000 which is used in this embodiment is preferably formed using single crystal silicon formed by the zinc reduction method. As described above, while being suitable for the base substrate 1000, single crystal silicon is separated from a silicon active layer forming an element, with an insulating oxide film provided therebetween. Therefore, the element characteristics are not influenced by the purity of single crystal silicon also in the case where single crystal silicon is used for a back-gate electrode. That is, single crystal silicon used for the base substrate 1000 mainly serves as a support. Therefore, low-price solar grade single crystal silicon with low purity can be used as the base substrate 1000.

On the contrary, the bond substrate 1010 used for the formation of the silicon active layer is formed using semiconductor-grade single crystal silicon. That is, in this embodiment, the base substrate 1000 and the bond substrate 1010 used for the formation of the silicon active layer can be formed using single crystal silicon with purity of different levels.

Further, in a conventional SOI substrate, the base substrate 1000 is formed using semiconductor-grade single crystal silicon to be the semiconductor layer 1016. This has been a factor of increasing cost for a material. By using as the base substrate 1000 a solar grade single crystal silicon substrate formed by the zinc reduction method in this embodiment, a high-performance device can be provided at a low price while the characteristics are not degraded.

Note that this embodiment can be combined with or replaced with any of the other embodiments as appropriate.

This application is based on Japanese Patent Application serial no. 2009-152177 filed with Japan Patent Office on Jun. 26, 2009, the entire contents of which are hereby incorporated by reference.

What is claimed is:

1. A semiconductor device comprising:
    a semiconductor layer comprising:
        a channel formation region; and
        a conductive region in contact with the channel formation region,
    wherein the semiconductor layer comprises a semiconductor material,
    a metal region in contact with the conductive region;
    a gate insulating layer in contact with the channel formation region;
    a gate electrode in contact with the gate insulating layer; and
    a source electrode or a drain electrode comprising a part of the metal region,
    wherein the semiconductor layer has a depression in the conductive region.

2. The semiconductor device according to claim 1, wherein a contact interface between the gate insulating layer and the channel formation region exists above a contact interface between the metal region and the conductive region.

3. The semiconductor device according to claim 1, wherein a concentration of an impurity element imparting one conductivity type which is added to the conductive region is higher than or equal to $1\times10^{19}$ cm$^{-3}$ and lower than or equal to $1\times10^{21}$ cm$^{-3}$.

4. The semiconductor device according to claim 1,
    wherein the conductive region includes a low conductive region in contact with the channel formation region and includes a high conductive region in contact with the low conductive region, and
    wherein a concentration of an impurity element imparting one conductivity type which is added to the low conductive region is higher than or equal to $1\times10^{19}$ cm$^{-3}$ and lower than or equal to $1\times10^{21}$ cm$^{-3}$, which is lower than a concentration of an impurity element imparting one conductivity type which is added to the high conductive region.

5. The semiconductor device according to claim 1, wherein the metal region also exists in a region not overlapping with the conductive region.

6. The semiconductor device according to claim 1, wherein the semiconductor layer is provided over an insulating layer.

7. The semiconductor device according to claim 6, wherein the insulating layer is provided on a base substrate.

8. The semiconductor device according to claim 7, wherein the base substrate is a substrate selected from the group consisting of a glass substrate, a single crystal silicon substrate, a polycrystalline silicon substrate, and a solar grade silicon substrate.

9. A semiconductor device comprising:
    a semiconductor layer comprising:
        a channel formation region; and
        a conductive region in contact with the channel formation region,
    wherein the semiconductor layer comprises a semiconductor material,
    a metal compound region comprising a metal compound comprising a metal element and the semiconductor material, and in contact with the conductive region;
    a metal region comprising the metal element, and in contact with a part of the metal compound region;
    a gate insulating layer in contact with the channel formation region;
    a gate electrode in contact with the gate insulating layer; and
    a source electrode or a drain electrode comprising a part of the metal region.

10. The semiconductor device according to claim 9, wherein a part of the gate electrode comprises the metal compound.

11. The semiconductor device according to claim 3, wherein a concentration of an impurity element imparting one conductivity type which is added to the conductive region is higher than or equal to $1\times10^{19}$ cm$^{-3}$ and lower than or equal to $1\times10^{21}$ cm$^{-3}$.

12. The semiconductor device according to claim 9,
wherein the conductive region includes a low conductive region in contact with the channel formation region and includes a high conductive region in contact with the low conductive region, and
wherein a concentration of an impurity element imparting one conductivity type which is added to the low conductive region is higher than or equal to $1\times10^{19}$ cm$^{-3}$ and lower than or equal to $1\times10^{21}$ cm$^{-3}$, which is lower than a concentration of an impurity element imparting one conductivity type which is added to the high conductive region.

13. The semiconductor device according to claim 9, wherein the metal region also exists in a region not overlapping with the conductive region.

14. The semiconductor device according to claim 9, wherein the semiconductor layer is provided over an insulating layer.

15. The semiconductor device according to claim 14, wherein the insulating layer is provided on a base substrate.

16. The semiconductor device according to claim 15, wherein the base substrate is a substrate selected from the group consisting of a glass substrate, a single crystal silicon substrate, a polycrystalline silicon substrate, and a solar grade silicon substrate.

17. The semiconductor device according to claim 9, wherein the gate electrode comprises a first region comprising the metal compound and a second region comprising the metal element.

* * * * *

UNITED STATES PATENT AND TRADEMARK OFFICE
CERTIFICATE OF CORRECTION

PATENT NO. : 8,390,065 B2  
APPLICATION NO. : 12/821477  
DATED : March 5, 2013  
INVENTOR(S) : Shunpei Yamazaki Page 1 of 1

It is certified that error appears in the above-identified patent and that said Letters Patent is hereby corrected as shown below:

In the Claims:

At column 30, line 63, "claim 3" should be --claim 9--.

Signed and Sealed this  
Twenty-first Day of May, 2013

Teresa Stanek Rea  
*Acting Director of the United States Patent and Trademark Office*